(12) United States Patent
Nagata

(10) Patent No.: US 11,289,151 B2
(45) Date of Patent: Mar. 29, 2022

(54) CROSS-COUPLED TRANSISTOR THRESHOLD VOLTAGE MISMATCH COMPENSATION AND RELATED DEVICES, SYSTEMS, AND METHODS

(71) Applicant: Micron Technology, Inc., Boise, ID (US)

(72) Inventor: Kyoichi Nagata, Kanagawa (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/678,394

(22) Filed: Nov. 8, 2019

(65) Prior Publication Data

US 2021/0142842 A1 May 13, 2021

(51) Int. Cl.
*G11C 7/00* (2006.01)
*G11C 11/4091* (2006.01)
*G11C 11/4094* (2006.01)
*G11C 11/4076* (2006.01)

(52) U.S. Cl.
CPC ...... *G11C 11/4091* (2013.01); *G11C 11/4094* (2013.01); *G11C 11/4076* (2013.01)

(58) Field of Classification Search
CPC ............ G11C 11/4091; G11C 11/4094; G11C 11/4076
USPC ........................................................ 365/149
See application file for complete search history.

(56) References Cited

U.S. PATENT DOCUMENTS

| 4,858,195 | A | * | 8/1989 | Soneda ................. H03K 3/011 365/205 |
| 5,841,708 | A | | 11/1998 | Nagata |
| 5,848,006 | A | | 12/1998 | Nagata |
| 5,995,432 | A | | 11/1999 | Nagata et al. |
| 6,009,020 | A | | 12/1999 | Nagata |
| 6,061,275 | A | | 5/2000 | Nagata |
| 8,208,324 | B2 | | 6/2012 | Michida et al. |
| 8,670,284 | B2 | | 3/2014 | Nagata |
| 8,804,395 | B2 | | 8/2014 | Nagata |
| 8,964,439 | B2 | | 2/2015 | Nagata |
| 9,159,401 | B2 | | 10/2015 | Nagata |
| 9,431,071 | B2 | * | 8/2016 | Moon ................. G11C 11/4091 |
| 9,520,177 | B2 | | 12/2016 | Matsumoto et al. |
| 9,711,207 | B2 | * | 7/2017 | Hush .................... G11C 7/1006 |
| 9,767,864 | B1 | * | 9/2017 | Penney ................ G11C 7/1006 |
| 9,837,139 | B2 | | 12/2017 | Nagata et al. |

(Continued)

*Primary Examiner* — Viet Q Nguyen
(74) *Attorney, Agent, or Firm* — TraskBritt

(57) ABSTRACT

Compensation for threshold voltage mismatches in cross-coupled pairs of transistors and related systems, devices, and methods are disclosed. An apparatus includes a cross-coupled pair of transistors, and a compensation pair of transistors. The cross-coupled pair of transistors includes a first transistor and a second transistor. A first gate of the first transistor is coupled to a first bit line and a second gate of the second transistor coupled to a second bit line. The compensation pair of transistors includes a third transistor and a fourth transistor. The third transistor is coupled in series with the first transistor between a first source of the first transistor and a common source line. The fourth transistor is coupled in series with the second transistor between a second source of the second transistor and the common source line. A memory device includes the sense amplifier. A computing system includes the memory device.

20 Claims, 13 Drawing Sheets

(56) References Cited

U.S. PATENT DOCUMENTS

| | | |
|---|---|---|
| 10,074,408 B2 * | 9/2018 | Seo .................... G11C 11/4097 |
| 10,181,344 B1 * | 1/2019 | Venkata ................ G11C 11/401 |
| 10,388,335 B2 | 8/2019 | Nagata |
| 10,482,931 B1 * | 11/2019 | Miyatake .................. G11C 7/12 |
| 10,535,388 B1 * | 1/2020 | Ingalls .................... G11C 7/12 |
| 10,586,586 B1 * | 3/2020 | Lee .................... G11C 11/4091 |
| 10,658,014 B2 * | 5/2020 | Lee ........................ G11C 7/065 |
| 10,714,153 B2 * | 7/2020 | Miyatake ............ G11C 11/4094 |
| 10,726,907 B2 * | 7/2020 | Derner ................ G11C 11/5657 |
| 10,811,061 B1 * | 10/2020 | Venkata ................ G11C 7/1069 |
| 10,839,871 B2 * | 11/2020 | Kawamura ......... G11C 11/4076 |
| 10,842,931 B2 * | 11/2020 | DeArmond ....... A61M 5/16836 |
| 10,872,648 B2 * | 12/2020 | Ingalls .................... G11C 8/10 |
| 10,885,970 B2 * | 1/2021 | Sun ...................... G06F 3/0659 |
| 2010/0149894 A1 | 6/2010 | Mochida et al. |
| 2010/0278002 A1 * | 11/2010 | Chen .................... G11C 11/413 |
| | | 365/226 |
| 2012/0250437 A1 | 10/2012 | Nagata |
| 2013/0215698 A1 | 8/2013 | Nagata |
| 2013/0294137 A1 | 11/2013 | Mochida et al. |
| 2014/0119143 A1 | 5/2014 | Nagata |
| 2014/0211545 A1 | 7/2014 | Nagata et al. |
| 2014/0328133 A1 | 11/2014 | Nagata |
| 2015/0124522 A1 | 5/2015 | Nagata |
| 2015/0302914 A1 | 10/2015 | Matsumoto et al. |
| 2018/0061480 A1 | 3/2018 | Nagata et al. |
| 2019/0051335 A1 * | 2/2019 | Nagata .................... G11C 11/22 |
| 2019/0237122 A1 * | 8/2019 | Nagata ................ G11C 11/2257 |

\* cited by examiner

CROSS-COUPLED TRANSISTOR THRESHOLD VOLTAGE MISMATCH COMPENSATION AND RELATED DEVICES, SYSTEMS, AND METHODS

FIELD

The present disclosure relates, generally, to compensation of mismatches between threshold voltages of cross-coupled transistors, and more specifically to threshold voltage mismatch compensation in sense amplifiers of memory devices.

BACKGROUND

Sense amplifiers that are used to detect data stored in memory elements (e.g., capacitive memory elements in Dynamic Random-Access Memory (DRAM)) sometimes include cross-coupled transistors. The cross-coupled transistors may enable detection of relatively small amounts of charge stored by the memory elements.

BRIEF DESCRIPTION OF THE DRAWINGS

While this disclosure concludes with claims particularly pointing out and distinctly claiming specific embodiments, various features and advantages of embodiments within the scope of this disclosure may be more readily ascertained from the following description when read in conjunction with the accompanying drawings, in which:

DETAILED DESCRIPTION

Figure 1:
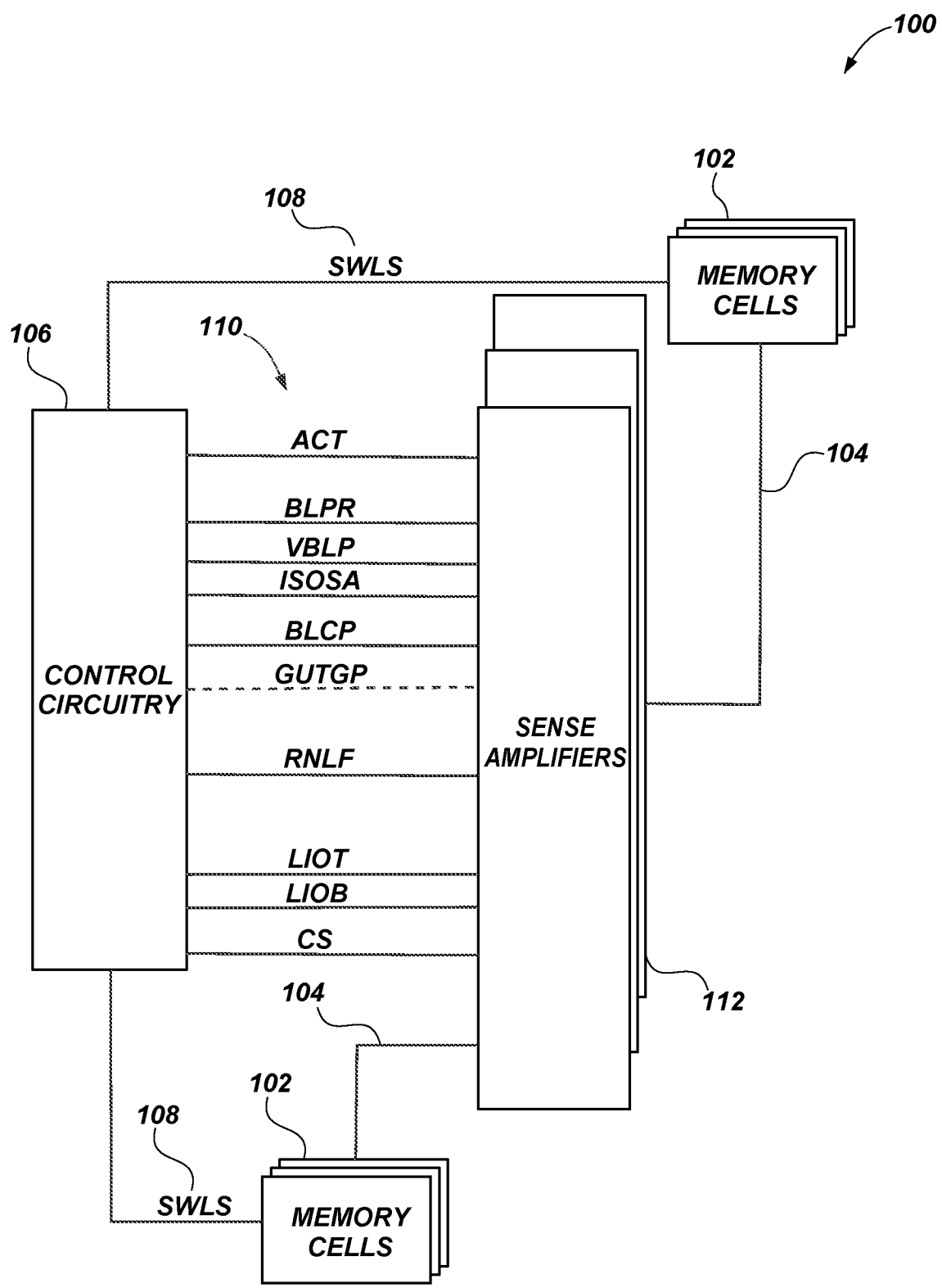
FIG. 1 is a block diagram of a memory device according to some embodiments.

In the following detailed description, reference is made to the accompanying drawings, which form a part hereof, and in which are shown, by way of illustration, specific examples of embodiments in which the present disclosure may be practiced. These embodiments are described in sufficient detail to enable a person of ordinary skill in the art to practice the present disclosure. However, other embodiments enabled herein may be utilized, and structural, material, and process changes may be made without departing from the scope of the disclosure.

The illustrations presented herein are not meant to be actual views of any particular method, system, device, or structure, but are merely idealized representations that are employed to describe the embodiments of the present disclosure. In some instances similar structures or components in the various drawings may retain the same or similar numbering for the convenience of the reader; however, the similarity in numbering does not necessarily mean that the structures or components are identical in size, composition, configuration, or any other property.

The following description may include examples to help enable one of ordinary skill in the art to practice the disclosed embodiments. The use of the terms "exemplary," "by example," and "for example," means that the related description is explanatory, and though the scope of the disclosure is intended to encompass the examples and legal equivalents, the use of such terms is not intended to limit the scope of an embodiment or this disclosure to the specified components, steps, features, functions, or the like.

It will be readily understood that the components of the embodiments as generally described herein and illustrated in the drawings could be arranged and designed in a wide variety of different configurations. Thus, the following description of various embodiments is not intended to limit the scope of the present disclosure, but is merely representative of various embodiments. While the various aspects of the embodiments may be presented in the drawings, the drawings are not necessarily drawn to scale unless specifically indicated.

Furthermore, specific implementations shown and described are only examples and should not be construed as the only way to implement the present disclosure unless specified otherwise herein. Elements, circuits, and functions may be shown in block diagram form in order not to obscure the present disclosure in unnecessary detail. Conversely, specific implementations shown and described are exemplary only and should not be construed as the only way to implement the present disclosure unless specified otherwise herein. Additionally, block definitions and partitioning of logic between various blocks is exemplary of a specific implementation. It will be readily apparent to one of ordinary skill in the art that the present disclosure may be practiced by numerous other partitioning solutions. For the most part, details concerning timing considerations and the like have been omitted where such details are not necessary to obtain a complete understanding of the present disclosure and are within the abilities of persons of ordinary skill in the relevant art.

Those of ordinary skill in the art would understand that information and signals may be represented using any of a variety of different technologies and techniques. Some drawings may illustrate signals as a single signal for clarity of presentation and description. It will be understood by a person of ordinary skill in the art that the signal may represent a bus of signals, wherein the bus may have a variety of bit widths and the present disclosure may be implemented on any number of data signals including a single data signal.

The various illustrative logical blocks, modules, and circuits described in connection with the embodiments disclosed herein may be implemented or performed with a general purpose processor, a special purpose processor, a digital signal processor (DSP), an Integrated Circuit (IC), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor (may also be referred to herein as a host processor or simply a host) may be a microprocessor, but in the alternative, the processor may be any conventional processor, controller, microcontroller, or state machine. A processor may also be implemented as a combination of computing devices, such as a combination of a DSP and a microprocessor, a plurality of microprocessors, one or more microprocessors in conjunction with a DSP core, or any other such configuration. A general-purpose computer including a processor is considered a special-purpose computer while the general-purpose computer is configured to execute computing instructions (e.g., software code) related to embodiments of the present disclosure.

The embodiments may be described in terms of a process that is depicted as a flowchart, a flow diagram, a structure diagram, or a block diagram. Although a flowchart may describe operational acts as a sequential process, many of these acts can be performed in another sequence, in parallel, or substantially concurrently. In addition, the order of the acts may be re-arranged. A process may correspond to a method, a thread, a function, a procedure, a subroutine, a subprogram, other structure, or combinations thereof. Furthermore, the methods disclosed herein may be implemented in hardware, software, or both. If implemented in software, the functions may be stored or transmitted as one or more instructions or code on computer-readable media. Computer-readable media includes both computer storage media and communication media including any medium that facilitates transfer of a computer program from one place to another.

Any reference to an element herein using a designation such as "first," "second," and so forth does not limit the quantity or order of those elements, unless such limitation is explicitly stated. Rather, these designations may be used herein as a convenient method of distinguishing between two or more elements or instances of an element. Thus, a reference to first and second elements does not mean that only two elements may be employed there or that the first element must precede the second element in some manner. In addition, unless stated otherwise, a set of elements may comprise one or more elements.

As used herein, the term "substantially" in reference to a given parameter, property, or condition means and includes to a degree that one of ordinary skill in the art would understand that the given parameter, property, or condition is met with a small degree of variance, such as, for example, within acceptable manufacturing tolerances. By way of example, depending on the particular parameter, property, or condition that is substantially met, the parameter, property, or condition may be at least 90% met, at least 95% met, or even at least 99% met.

Sense amplifiers sometimes include a cross-coupled pair of transistors used to amplify memory element readings in memory devices. By way of non-limiting example, in DRAM devices, sense amplifiers may be used to amplify readings taken from capacitive memory elements. In some instances, however, the transistors of the cross-coupled pair of transistors may have mismatched threshold voltages. In these instances, a relatively large charge or discharge current on the bit line may result due to the mismatched threshold voltages of the transistors in the cross-coupled pair of transistors. Also, due to increased capacitance and resistance of bit lines resulting from increased numbers of data charge storage elements being coupled to bit lines, a relatively large amount of time may pass as the bit line charges or discharges. In instances where sufficient time is not allotted to fully charge or discharge the bit line, sense margin deficiencies may occur.

Disclosed herein are sense amplifiers configured to compensate for threshold voltage mismatch of cross-coupled pair of transistors, and related systems, methods, and devices. In some embodiments these sense amplifiers eliminate bit line charging and discharging during a threshold voltage compensation operation. Since these sense amplifiers avoid delays associated with charging and discharging the bit lines, relatively long bit lines connected to relatively large numbers of memory elements may be used without unduly increasing row address to column address delay (TRCD).

FIG. 1 is a block diagram of a memory device 100 according to some embodiments. The memory device 100 includes control circuitry 106, one or more sense amplifiers 112, and memory cells 102. The sense amplifiers 112 are operably coupled to the memory cells 102 via one or more bit lines 104. The control circuitry 106 is operably coupled to the memory cells 102 via one or more shared word lines, SWLs 108. The SWLs 108 enable the control circuitry 106 to control access to the memory cells 102.

The control circuitry 106 is also operably coupled to the sense amplifiers 112 via various control signal connections 110. For example, the control signal connections 110 may include common source lines ACT, RNLF, bit line precharge control lines BLPR, BLCP, a bit line voltage reference line VBLP, a sense amplifier isolation line ISOSA, a column select line CS, and local input output lines LIOT, LIOB. In some embodiments the control signal connections 110 may include a GUTGP control signal (e.g., FIG. 4). The control circuitry is configured to provide control signals and voltage biases to the sense amplifiers 112 using these control signal connections 110, as will be discussed in more detail below.

Figure 2:
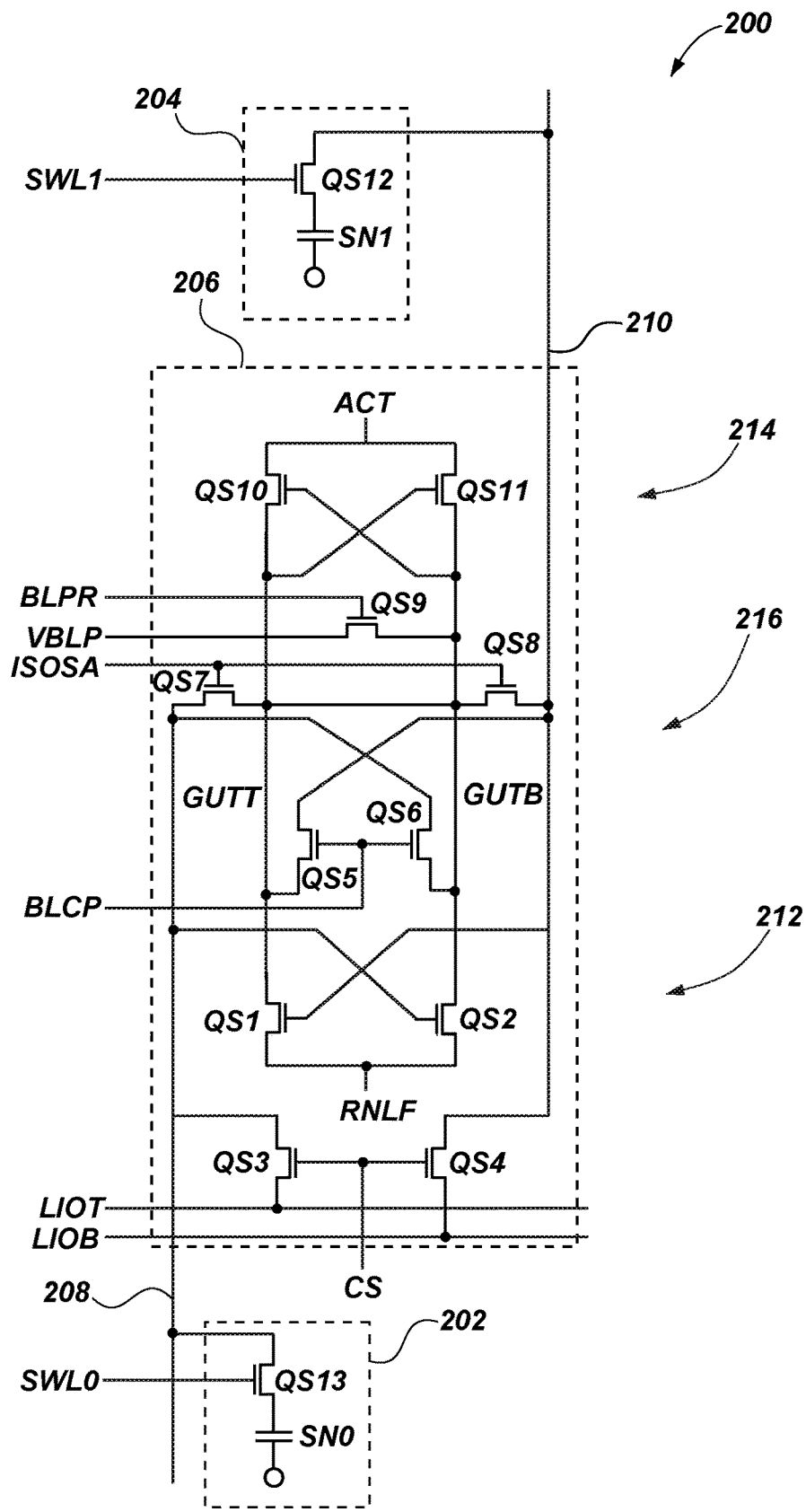
FIG. 2 is a circuit schematic illustration of a portion of an example of the memory device of FIG. 1.

FIG. 2 is a circuit schematic illustration of a portion 200 of an example of the memory device 100 of FIG. 1. The portion 200 includes a sense amplifier 206 operably coupled to memory cell 202 via a first bit line 208 and to memory cell 204 via a second bit line 210. Although FIG. 2 only shows memory cell 202 and memory cell 204, the first bit line 208 and the second bit line 210 may each be operably coupled to many memory cells. Memory cell 202 includes a storage capacitor SN0 and an access transistor QS13. The storage capacitor SN0 may be accessed using the access transistor QS13. Similarly, memory cell 204 includes a storage capacitor SN1 and an access transistor QS12. The storage capacitor SN1 may be accessed using the access transistor QS12. The memory cell 202 is operably coupled to control circuitry (e.g., the control circuitry 106 of FIG. 1) through a shared word line SWL0 (operably coupled to a gate of access transistor QS13), and the memory cell 204 is operably coupled to the control circuitry through a shared word line SWL1 (operably coupled to a gate of access transistor QS12). Accordingly, the control circuitry controls access to the storage capacitors SN0, SN1 by biasing the gates of access transistors QS13 and QS12 via the shared word lines SWL0 and SWL1, respectively.

The sense amplifier 206 includes a cross-coupled pair of transistors 212 including transistors QS1 and Qs2. The cross-coupled pair of transistors 212 is configured to amplify signals read from the memory cells (e.g., memory cell 202 and memory cell 204) coupled to the first bit line 208 and the second bit line 210. A gate of transistor QS1 is operably coupled to the second bit line 210, and a gate of transistor QS2 is operably coupled to the first bit line 208. Sources of transistors QS1 and QS2 are operably coupled to a common source line RNLF. A drain of transistor QS1 is operably coupled to a GUTT line, and a drain of transistor QS2 is operably coupled to a GUTB line. Transistors QS1 and QS2 may be N-type metal oxide semiconductor transistors (NMOS transistors). Accordingly, transistors QS1 and QS2 may be pull-down transistors.

The sense amplifier 206 also includes a cross-coupled pair of pull-up transistors 214 in series with the cross-coupled pair of transistors 212. The cross-coupled pair of pull-up transistors 214 includes transistors QS10 and QS11. Transistors QS10 and QS11 may be P-type metal oxide semiconductor transistors (PMOS transistors). A drain of transistor QS10 is operably coupled to the GUTT line, and a drain of transistor QS11 is operably coupled to the GUTB line. A gate of transistor QS10 is operably coupled to the GUTB line, and a gate of transistor QS11 is operably coupled to the GUTT line. Sources of transistors QS10 and QS11 are operably coupled to a common source line ACT.

Although the cross-coupled pair of transistors 212 are discussed as being NMOS transistors and the cross-coupled pair of pull-up transistors 214 are discussed as being PMOS transistors, it will be appreciated that in some embodiments the cross-coupled pair of transistors 212 may be PMOS transistors and the cross-coupled pair of pull-up transistors 214 may be NMOS transistors without departing from the scope of the disclosure.

The sense amplifier 206 further includes pre-charge circuitry 216 configured to pre-charge the GUTB and GUTT lines prior to sensing the bit lines (first bit line 208 and second bit line 210) during a read operation. The pre-charge circuitry 216 includes isolation transistors QS7 and QS8 configured selectively operably couple and isolate the GUTT line to and from the first bit line 208 and the GUTB line to and from the second bit line 210. Gates of the isolation transistors QS7 and QS8 are operably coupled to an isolation control line ISOSA, which is operably coupled to control circuitry (e.g., the control circuitry 106 of FIG. 1). Accordingly, the control circuitry controls isolation or connection between the GUTT line and the first bit line 208, and between the GUTB line and the second bit line 210 by asserting signals on the isolation control line ISOSA.

The pre-charge circuitry 216 also includes transistor QS9 operably coupled between the GUTB line and a pre-charge voltage potential line VBLP. The VBLP line is configured to provide a pre-charge voltage potential to the GUTB line to pre-charge the GUTB and GUTT lines prior to sensing the first bit line 208 and the second bit line 210 during a read operation. A gate of transistor QS9 is operably coupled to pre-charge control line BLPR, which is operably coupled to the control circuitry (e.g., the control circuitry 106 of FIG. 1). Accordingly, the control circuitry is configured to control connection and isolation of the GUTB line to and from the VBLP line by asserting signals on the pre-charge control line BLPR.

The pre-charge circuitry 216 further includes transistors QS5 and QS6. Transistor QS5 is operably coupled between the second bit line 210 and the GUTT line. Transistor QS6 is operably coupled between the first bit line 208 and the GUTB line. Gates of transistors Q5 and Q6 are operably coupled to a pre-charge control line BLCP, which is operably coupled to the control circuitry (e.g., the control circuitry 106 of FIG. 1). Accordingly, the control circuitry is configured to control connection and isolation between the second bit line 210 and the GUTT line, and between the first bit line 208 and the GUTB line by asserting signals on the pre-charge control line BLCP.

The sense amplifier 206 includes transistors QS3 and QS4 configured to control access of the control circuitry to the bit lines (first bit line 208 and second bit line 210). Transistor QS3 is operably coupled between the first bit line 208 and a local input/output line LIOT. Transistor QS4 is operably coupled between the second bit line 210 and local input/output line LIOB. Gates of transistors QS3 and QS4 are operably coupled to a column select line CS. The column select line CS and the local input/output lines LIOT and LIOB are operably coupled to the control circuitry (e.g., the control circuitry 106 of FIG. 1). Accordingly, the control circuitry is configured to control its access to the first bit line 208 and the second bit line 210 by asserting signals on the column select line CS.

It should be noted that transistors QS3, QS4, QS5, QS6, QS7, QS8, QS9, QS12, and QS13 may be either NMOS or PMOS transistors. Accordingly, if any one of these transistors is an NMOS transistor, asserting the gate involves providing a voltage potential to the gate thereof that is at least a threshold voltage potential above the source voltage potential, switching the transistor into a saturation mode to electrically connect the source thereof to the drain thereof. Equally, if any one of these transistors is a PMOS transistor, asserting the gate involves providing a voltage potential to the gate thereof that is at least a threshold voltage potential below the source voltage potential, switching the transistor into a saturation mode to electrically connect the source thereof to the drain thereof. Accordingly, wherever herein it is discussed that the gate of a transistor is asserted, for PMOS transistors this assertion of the transistor may include providing a logic level low voltage potential to the gate and for NMOS transistors this assertion may include providing a logic level high voltage potential to the gate. Also, "turning on" a transistor refers to applying appropriate voltage potentials to the gate, source, and drain to operate the transistor in the saturation mode in which the source and drain nodes are coupled together. Further, "turning off" a transistor refers to applying appropriate voltage potentials to the gate, source, and drain to operate the transistor in a cutoff mode during which the transistor conducts negligible current.

Figure 3:
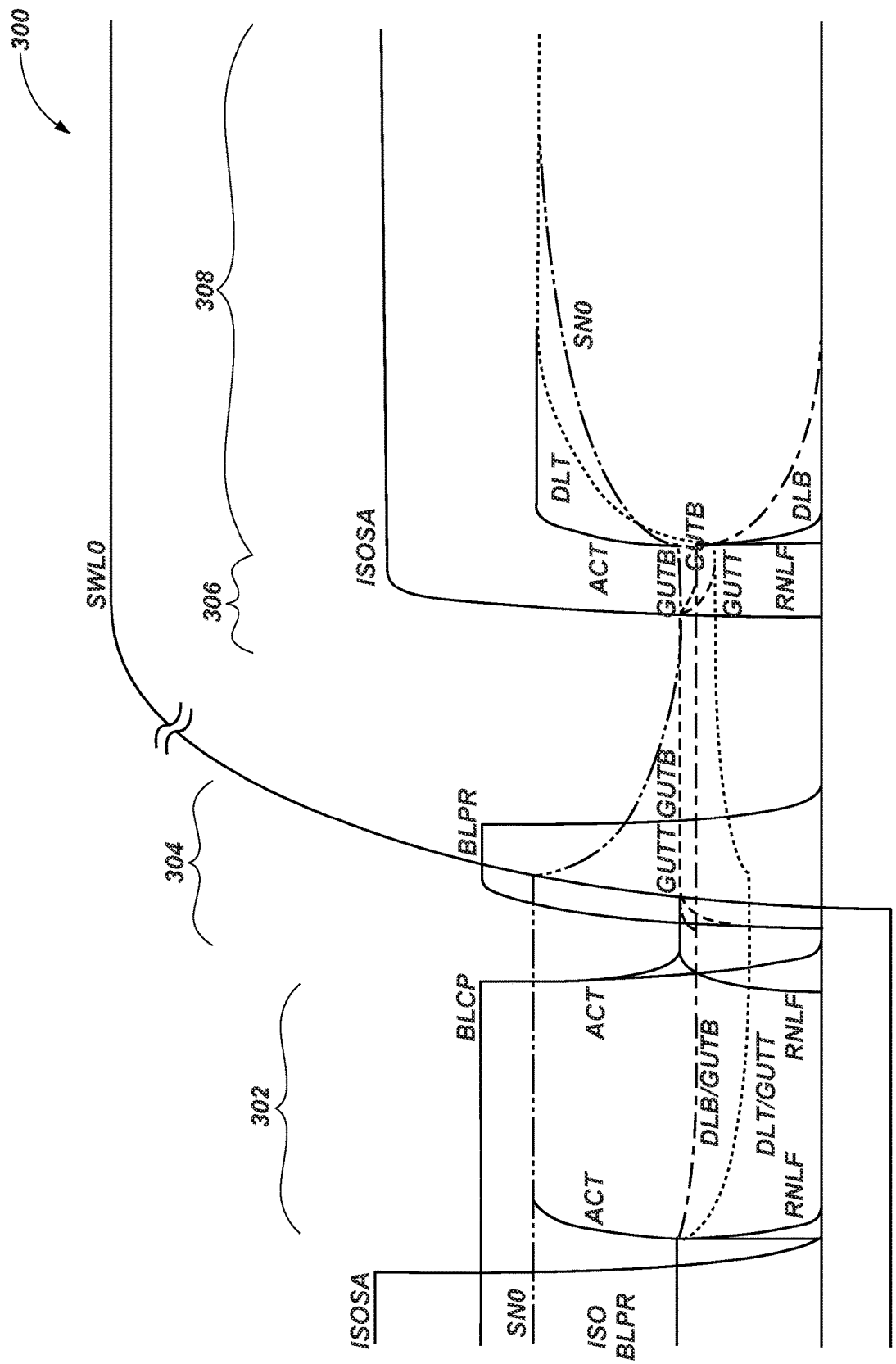
FIG. 3 is a signal timing diagram of signals of the portion illustrated in FIG. 2.

FIG. 3 is a signal timing diagram 300 of signals of the portion 200 illustrated in FIG. 2. Referring to FIG. 2 and FIG. 3 together, the signal timing diagram 300 includes several signals corresponding to various command/signal lines of FIG. 2 for a read operation performed on memory cell 202. For example, the signal timing diagram 300 includes SWL0, BLCP, BLPR, and ISOSA signals provided by the control circuitry (e.g., the control circuitry 106 of FIG. 1) to the SWL0, BLCP, BLPR, and ISOSA lines of FIG. 2. The signal timing diagram 300 also includes common source voltage potentials ACT, RNLF provided by the control circuitry to the ACT, RNLF lines of FIG. 2. The signal timing diagram 300 further includes voltage potential measurements SN0, DLT, DLB, GUTT, and GUTB. The voltage potential measurement SN0 (at a logic level high in FIG. 3) is measured at the storage capacitor SN0 of the memory cell 202. The voltage potential measurements DLB and DLT are measured at the first bit line 208 and the second bit line 210, respectively. The voltage potential measurements GUTT and GUTB are measured at the GUTT and GUTB lines, respectively.

The signal timing diagram 300 is illustrated over several periods of time. For example, the signal timing diagram 300 includes a VtC compensation period of time 302, a pre-charge period of time 304, a bit line coupling period of time 306, and a main sensing period of time 308. During the VtC compensation period of time 302 the control circuitry de-asserts the ISOSA signal to turn off transistors QS7 and QS8, electrically isolating the GUTT line from the first bit line 208 and electrically isolating the GUTB line from the second bit line 210. Also during the VtC compensation period of time 302 the control circuitry de-asserts the BLPR signal, turning off transistor QS9, and electrically isolating the GUTB line from the pre-charge voltage potential. Further during the VtC compensation period of time 302 the control circuitry asserts the BLCP signal, turning on transistors QS5 and QS6, operably coupling the GUTT line to the second bit line 210 and the GUTB line to the first bit line 208. The control circuitry holds the common source signals ACT and RNLF to a logic level high (e.g., VDD) and a logic level low (e.g., VSS), respectively, during the VtC compensation period of time 302.

With the GUTT line coupled to the second bit line 210 and the GUTB line coupled to the first bit line 208 during the VtC compensation period of time 302, the drains of the cross-coupled pair of transistors 212 are driven to substantially the same voltage potentials as their gates. With the drains of the cross-coupled pair of transistors 212 coupled to their gates, the cross-coupled pair of transistors 212 will operate in the saturation mode. Accordingly, once the bit lines (first bit line 208, second bit line 210) have charged/discharged, the gate to source voltage of the cross-coupled pair of transistors 212 will be greater than or equal to the threshold voltages of the cross-coupled pair of transistors 212, regardless of any mismatch between the threshold voltage of transistors QS1 and QS2. Depending on how much capacitance and resistance is on the bit lines, this charging/discharging of the bit lines may take a relatively large amount of time.

During the pre-charge period of time 304 the pre-charge control signal BLCP is de-asserted, turning off transistors QS5 and QS6, and electrically isolating the GUTT line from the second bit line 210 and the GUTB line from the first bit line 208. Also during the pre-charge period of time 304 the common source signals ACT and RNLF are held at the pre-charge voltage potential VBLP. Further during the pre-charge period of time 304 the pre-charge control signal BLPR is asserted, turning on transistor QS9 and operably coupling the pre-charge voltage potential VBLP to GUTB. As a result, the GUTB and GUTT lines return to the pre-charge voltage potential VBLP.

The SWL0 signal may also be asserted during the pre-charge period of time 304. As a result, the storage capacitor SN0 begins to discharge towards the pre-charge voltage potential VBLP. Near the end of or following the pre-charge period of time 304 the pre-charge control signal BLPR may be de-asserted, turning off transistor QS9 and electrically isolating the GUTB line from the pre-charge voltage potential VBLP.

During the bit line coupling period of time 306 the ISOSA control signal is asserted, turning on transistors QS7 and QS8 and operably coupling the GUTT line to the first bit line 208 and the GUTB to the second bit line 210. As a result, the GUTT line and the GUTB line are held at substantially the same voltage potentials as the first bit line 208 and the second bit line 210, respectively.

During the main sensing period of time 308 the common source signals ACT and RNLF are held at the logic level high and the logic level low, respectively. As a result, the cross-coupled pair of transistors 212 amplify the signals on the GUTT line and the GUTB line, driving the SN0 measurement towards a power rail corresponding to its stored charge level (e.g., a logic level high in FIG. 3). The voltage potential measurements DLT and DLB on the first bit line 208 and the second bit line 210 are also driven towards the power rails (DLT to logic level high and DLB to logic level low in FIG. 3). The storage capacitor SN0 may then be read (e.g., using the local input/output lines (LIOT and LIOB)).

Figure 4:
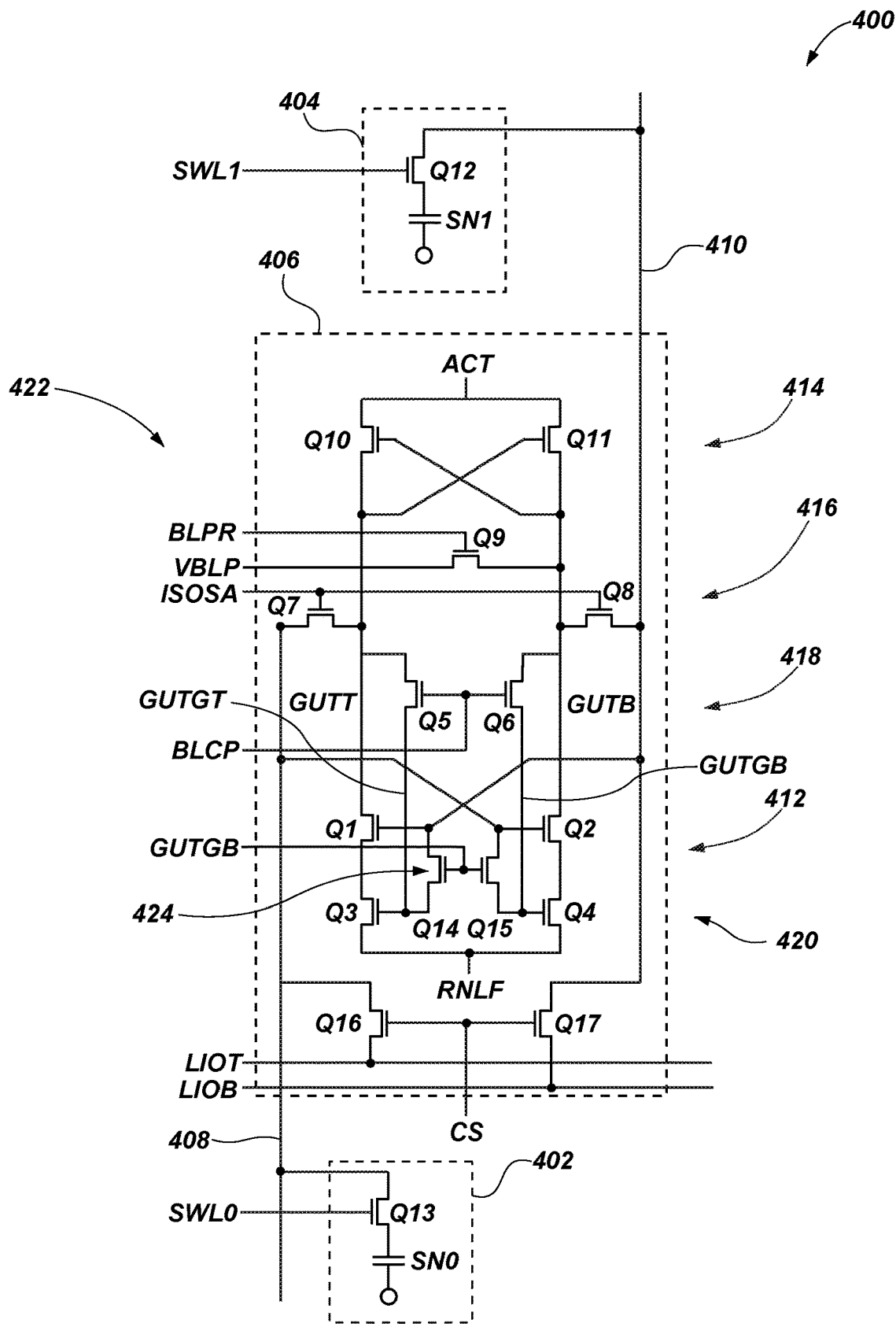
FIG. 4 is a circuit schematic illustration of a portion of another example of the memory device of FIG. 1.
Figure 5:
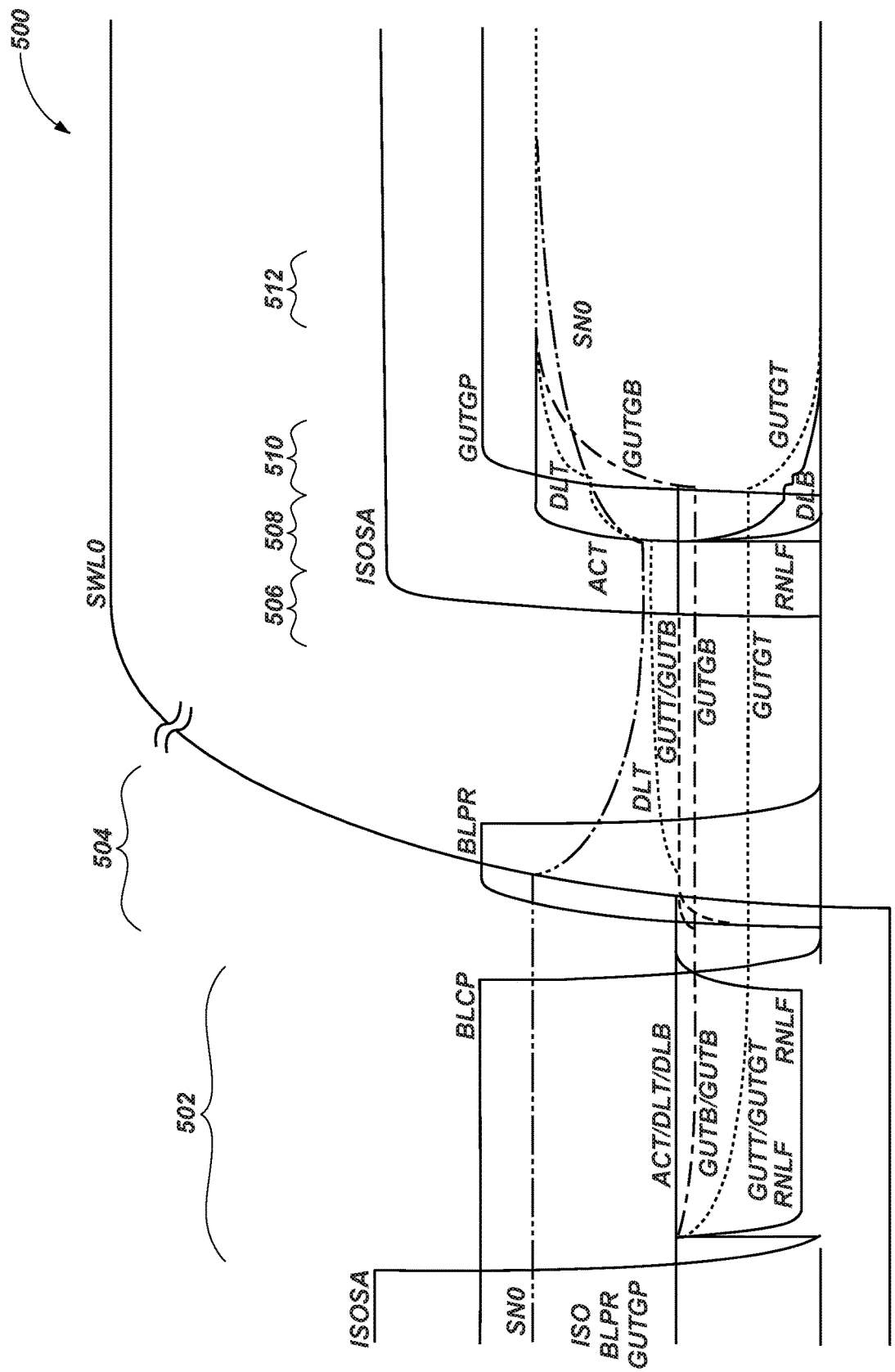
FIG. 5 is a signal timing diagram of signals of the portion illustrated in FIG. 4.

Although any mismatch between the threshold voltages of the cross-coupled pair of transistors 212 is compensated for during the VtC compensation period of time 302, this VtC compensation period of time 302 may take a relatively long time to complete if a large number of memory cells are coupled to the bit lines (e.g., first bit line 208 and second bit line 210), resulting in a relatively high capacitance and a relatively high resistance of the bit lines. Since the charge time of the bit lines is a function of capacitance and resistance, relatively high capacitance and/or resistance on the bit lines results in relatively long charge times. FIG. 4 and FIG. 5 illustrate an example that decouples the GUTT and GUTB lines from the bit lines (first bit line 208 and second bit line 210) during a VtC compensation period of time, resulting in reduced time for the VtC compensation period of time as compared to the example portion 200 discussed in FIG. 2 and FIG. 3.

As previously discussed, various transistors in the example portion 200 of FIG. 2 may be either NMOS or PMOS transistors. It will be apparent to those skilled in the art that in such embodiments where a PMOS transistor is used in place of an NMOS transistor, or vice versa, the signals of the signal timing diagram 300 may be reversed (logic level high voltage potentials provided to NMOS transistors correspond to logic level low voltage potentials provided to PMOS transistors, etc.).

FIG. 4 is a circuit schematic illustration of a portion 400 of another example of the memory device 100 of FIG. 1. Similar to the portion 200 of FIG. 2, the portion 400 includes a sense amplifier 406 operably coupled to memory cell 402 via a first bit line 408 and to memory cell 404 via a second bit line 410. Although FIG. 4 only shows memory cell 402 and memory cell 404, the first bit line 408 and the second bit line 410 may each be operably coupled to many memory cells. Memory cell 402 includes a storage capacitor SN0 and an access transistor Q13. The storage capacitor SN0 may be accessed using the access transistor Q13. Similarly, memory cell 404 includes a storage capacitor SN1 and an access transistor Q12. The storage capacitor SN1 may be accessed using the access transistor Q12. The memory cell 402 is operably coupled to control circuitry (e.g., the control circuitry 106 of FIG. 1) through a shared word line SWL0 (operably coupled to a gate of access transistor Q13), and the memory cell 404 is operably coupled to the control circuitry through a shared word line SWL1 (operably coupled to a gate of access transistor Q12). Accordingly, the control circuitry controls access to the storage capacitors SN0, SN1 by biasing the gates of access transistors Q13 and Q12 via the shared word lines SWL0 and SWL1, respectively.

The sense amplifier 406 includes a cross-coupled pair of transistors 412 including a first transistor Q1 and a second transistor Q2. The cross-coupled pair of transistors 412 is configured to amplify signals read from the memory cells (e.g., memory cell 402 and memory cell 404) coupled to the first bit line 408 and the second bit line 410. A first gate of first transistor Q1 is operably coupled to the second bit line 410, and a second gate of second transistor Q2 is operably coupled to the first bit line 408. Sources of transistors Q1 and Q2 are operably coupled to a common source line RNLF. A first drain of first transistor Q1 is operably coupled to a GUTT line, and a second drain of second transistor Q2 is operably coupled to a GUTB line. Transistors Q1 and Q2 may be N-type metal oxide semiconductor transistors (NMOS transistors). Accordingly, the cross-coupled pair of transistors 412 Q1 and Q2 may be pull-down transistors.

In contrast to the sense amplifier 206 of FIG. 2, the sense amplifier 406 includes a compensation pair of transistors 420 (a third transistor Q3 and a fourth transistor Q4) operably coupled in series with the cross-coupled pair of transistors 412 between sources of the cross-coupled pair of transistors 412 and a common source line RNLF. In other words, a third drain of the third transistor Q3 is operably coupled to a first source of the first transistor Q1, a third source of the third transistor Q1 is operably coupled to the common source line RNLF, a fourth drain of the fourth transistor Q4 is operably coupled to a second source of the second transistor Q2, and a fourth source of the fourth transistor Q4 is operably coupled to the common source line RNLF. The compensation pair of transistors 420 is configured to self-compensate threshold voltage mismatch between the first transistor Q1 and the second transistor Q2 of the cross-coupled pair of transistors 412. Accordingly, the compensation pair of transistors 420 may be of the same type of transistors as the cross-coupled pair of transistors 412 (e.g., NMOS transistors in the example of FIG. 4).

Gate terminals of the compensation pair of transistors 420 may be selectively electrically isolated in an electrical floating state or operably coupled to gate terminals and drain terminals (i.e., a GUTT line and a GUTB line) of the cross-coupled pair of transistors 412. The sense amplifier 406 includes a drain coupling pair of transistors 418 (Q5 and Q6) configured to selectively operably couple a third gate (i.e., a GUTGT line) of the third transistor Q3 to a first drain of the first transistor Q1 (the GUTT line) and a fourth gate (e.g., a GUTGB line) of the fourth transistor Q4 to a second drain of the second transistor Q2 (the GUTB line). Gate terminals of the drain coupling pair of transistors 418 may be operably coupled to a pre-charge control BLCP, which is operably coupled to control circuitry (e.g., the control circuitry 106 of FIG. 1). As a result, in a threshold voltage compensation operation the control circuitry may assert the gate terminals of the drain coupling pair of transistors 418 to operably couple the gate terminals of the compensation pair of transistors 420 to the drain terminals of the cross-coupled pair of transistors 412 until the compensation pair of transistors 420 are biased in a saturation state, compensating for any threshold voltage mismatch between the first transistor Q1 and the second transistor Q2. With the compensation pair of transistors 420 biased in the saturation state, the gate terminals of the compensation pair of transistors 420 may be electrically isolated (e.g., by de-asserting gate terminals of the drain coupling pair of transistors 418) in an electrically floating state. The compensation pair of transistors 420 may remain in a saturation state because a parasitic capacitance (e.g., about one femto Farad (1 fF)) at the gate terminals may store the bias at the gate terminals of the compensation pair of transistors 420 while the gate terminals are isolated in the electrically floating state.

The sense amplifier 406 also includes a gate coupling pair of transistors 424 (Q14, Q15) configured to selectively operably couple the gate terminals of the compensation pair of transistors 420 to the gate terminals of the cross-coupled pair of transistors 412. Gate terminals of the gate coupling pair of transistors 424 are operably coupled to a control line GUTGP, which is operably coupled to control circuitry (e.g., the control circuitry 106 of FIG. 1). Accordingly, the control circuitry may selectively operably couple or electrically isolate the third gate of the third transistor Q3 to or from the first gate of the first transistor Q1 and the fourth gate of the fourth transistor Q4 to or from the second gate of the second transistor Q2 by asserting and de-asserting a GUTGP signal on the GUTGP line.

The sense amplifier 206 also includes a cross-coupled pair of pull-up transistors 414 in series with the cross-coupled pair of transistors 412. The cross-coupled pair of pull-up transistors 414 includes transistors Q10 and Q11. Transistors Q10 and Q11 may be P-type metal oxide semiconductor transistors (PMOS transistors). A drain of transistor Q10 is operably coupled to the GUTT line, and a drain of transistor Q11 is operably coupled to the GUTB line. A gate of transistor Q10 is operably coupled to the GUTB line, and a gate of transistor Q11 is operably coupled to the GUTT line. Sources of transistors Q10 and Q11 are operably coupled to a common source line ACT.

Although the cross-coupled pair of transistors 412 and the compensation pair of transistors 420 are discussed as being NMOS transistors and the cross-coupled pair of pull-up transistors 414 are discussed as being PMOS transistors, it will be appreciated that in some embodiments the cross-coupled pair of transistors 412 and the compensation pair of transistors 420 may be PMOS transistors and the cross-coupled pair of pull-up transistors 414 may be NMOS transistors without departing from the scope of the disclosure.

The sense amplifier 406 further includes pre-charge circuitry 422 configured to pre-charge the GUTB and GUTT lines prior to sensing the bit lines (first bit line 408 and second bit line 410) during a read operation. The pre-charge circuitry 216 includes an isolation pair of transistors 416 (Q7 and Q8) configured selectively operably couple and isolate the GUTT line to and from the first bit line 408 and the GUTB line to and from the second bit line 410. Gates of the isolation pair of transistors 416 are operably coupled to an isolation control line ISOSA, which is operably coupled to control circuitry (e.g., the control circuitry 106 of FIG. 1). Accordingly, the control circuitry controls isolation or connection between the GUTT line and the first bit line 408, and between the GUTB line and the second bit line 410 by asserting or de-asserting signals on the isolation control line ISOSA.

The pre-charge circuitry 422 also includes transistor Q9 operably coupled between the GUTB line and a pre-charge voltage potential line VBLP. The VBLP line is configured to provide a pre-charge voltage potential to the GUTB line to pre-charge the GUTB and GUTT lines prior to sensing the first bit line 408 or the second bit line 410 during a read operation. A gate of transistor Q9 is operably coupled to pre-charge control line BLPR, which is operably coupled to the control circuitry (e.g., the control circuitry 106 of FIG. 1). Accordingly, the control circuitry is configured to control connection and isolation of the GUTB line to and from the VBLP line by asserting signals on the pre-charge control line BLPR.

The sense amplifier 206 includes transistors Q16 and Q17 configured to control access of the control circuitry to the bit lines (first bit line 408 and second bit line 410). Transistor Q16 is operably coupled between the first bit line 408 and a local input/output line LIOT. Transistor Q17 is operably coupled between the second bit line 410 and local input/output line LIOB. Gates of transistors Q16 and Q17 are operably coupled to a column select line CS. The column select line CS and the local input/output lines LIOT and LIOB are operably coupled to the control circuitry (e.g., the control circuitry 106 of FIG. 1). Accordingly, the control circuitry is configured to control its access to the first bit line 208 and the second bit line 210 by asserting signals on the column select line CS.

It should be noted that transistors Q16, Q17, Q5, Q6, Q7, Q8, Q9, Q12, and Q13 may be either NMOS or PMOS transistors. Accordingly, if any one of these transistors is an NMOS transistor, asserting the gate involves providing a voltage potential to the gate thereof that is at least a threshold voltage potential above the source voltage potential, switching the transistor into a saturation mode to electrically connect the source thereof to the drain thereof. Equally, if any one of these transistors is a PMOS transistor, asserting the gate involves providing a voltage potential to the gate thereof that is at least a threshold voltage potential below the source voltage potential, switching the transistor into a saturation mode to electrically connect the source thereof to the drain thereof.

FIG. 5 is a signal timing diagram 500 of signals of the portion 400 illustrated in FIG. 4. Referring to FIG. 4 and FIG. 5 together, the signal timing diagram 500 includes several signals corresponding to various command/signal lines of FIG. 4 for a read operation performed on memory cell 402. For example, the signal timing diagram 500 includes SWL0, BLCP, BLPR, ISOSA, and GUTGP signals provided by the control circuitry (e.g., the control circuitry 106 of FIG. 1) to the SWL0, BLCP, BLPR, ISOSA, and GUTGP lines of FIG. 4. The signal timing diagram 500 also includes common source voltage potentials ACT, RNLF provided by the control circuitry to the ACT, RNLF lines of FIG. 4. The signal timing diagram 500 further includes voltage potential measurements SN0, DLT, DLB, GUTT, GUTB, GUTGT, and GUTGB. The voltage potential measurement SN0 (at a logic level high in FIG. 5) is measured at the storage capacitor SN0 of the memory cell 402. The voltage potential measurements DLB and DLT are measured at the first bit line 208 and the second bit line 210, respectively. The voltage potential measurements GUTT, GUTB, GUTGT, and GUTGB are measured at the GUTT, GUTB, GUTGT, and GUTGB lines, respectively.

The signal timing diagram 500 is illustrated over several periods of time. For example, the signal timing diagram 500 includes a threshold voltage compensation period of time 502, a pre-charge period of time 504, a sense amplifier connection period of time 506, a sense amplifier powering period of time 508, a gate coupling period of time 510, and a sense period of time 512.

Figure 6:
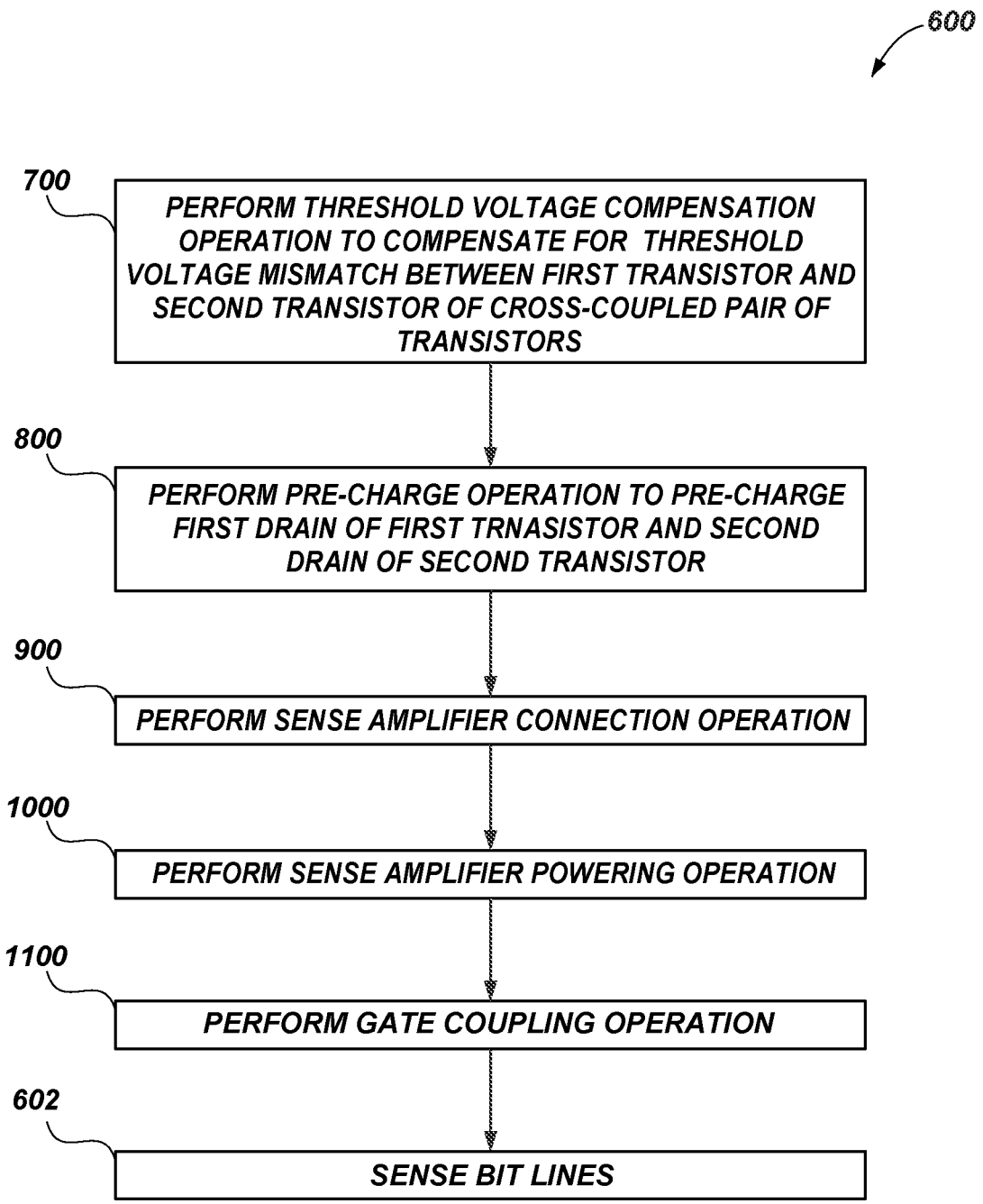
FIG. 6 is a flowchart illustrating a method of operating a sense amplifier of FIG. 4 in a read operation.

FIG. 6 is a flowchart illustrating a method 600 of operating the sense amplifier 406 of FIG. 4 in a read operation. Referring to FIG. 4, FIG. 5, and FIG. 6 together, the method 600 includes a threshold voltage compensation operation 700 corresponding to the threshold voltage compensation period of time 502 of FIG. 5, a pre-charge operation 800 corresponding to pre-charge period of time 504, a sense amplifier connection operation 900 corresponding to the sense amplifier connection period of time 506, a sense amplifier powering operation 1000 corresponding to the sense amplifier powering period of time 508, a gate coupling operation 1100 corresponding to the gate coupling period of time 510, and an operation 602 (e.g., a sense operation) corresponding to the sense period of time 512.

In threshold voltage compensation operation 700, method 600 compensates for threshold voltage mismatch between the first transistor Q1 and the second transistor Q2 of the cross-coupled pair of transistors 412.

Figure 7:
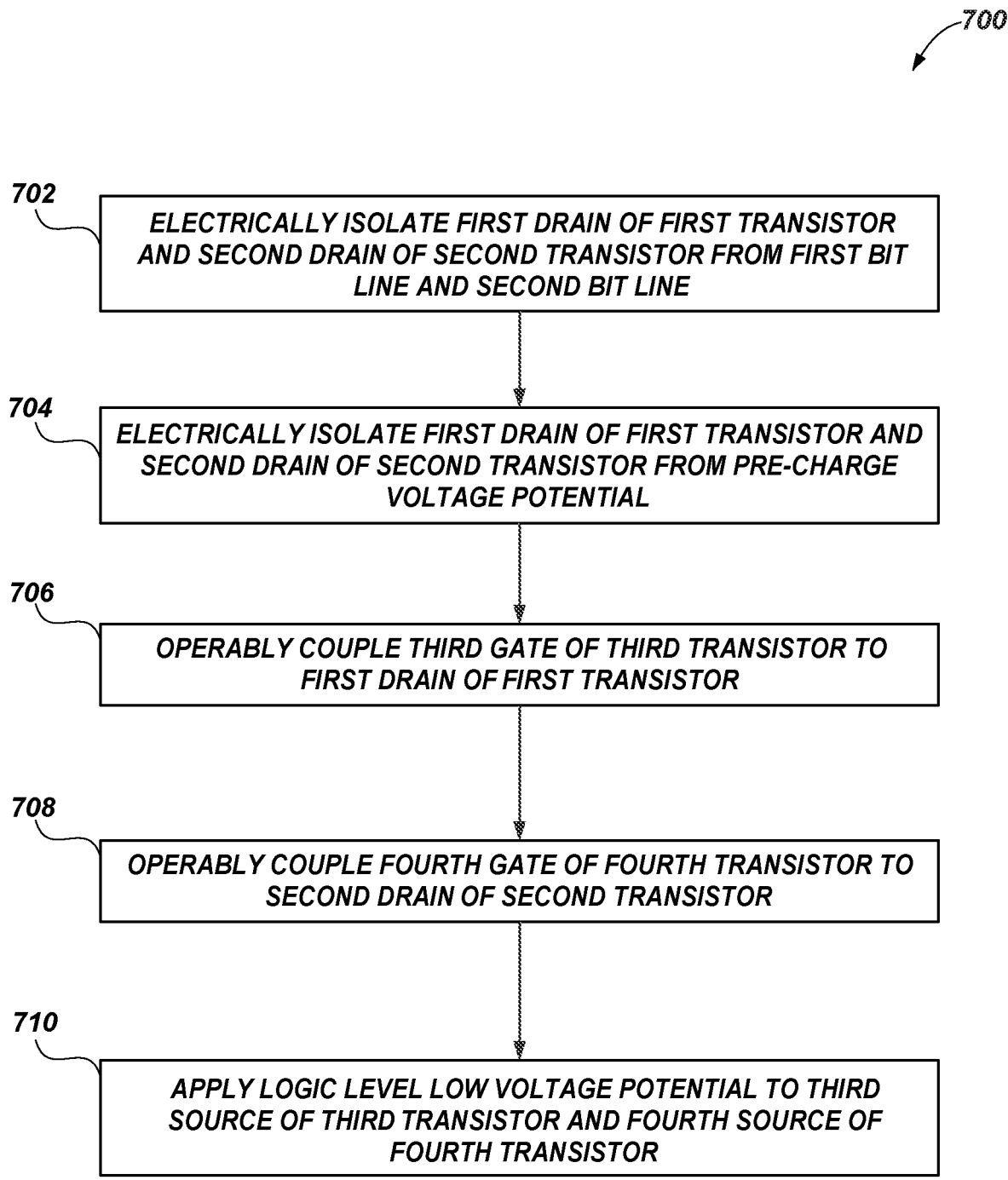
FIG. 7 is a flowchart illustrating an example of a threshold voltage compensation operation of the method of FIG. 6.

FIG. 7 is a flowchart illustrating an example of the threshold voltage compensation operation 700 of the method 600 of FIG. 6. Referring to FIG. 4, FIG. 5, FIG. 6, and FIG. 7 together, in sub-operation 702, threshold voltage compensation operation 700 electrically isolates the first drain of the first transistor Q1 and the second drain of the second transistor Q2 from a first bit line 408 and a second bit line 410. For example, control circuitry may de-assert the ISOSA signal on the ISOSA line during the threshold voltage compensation period of time 502, as illustrated in the signal timing diagram 500, to turn off the isolation pair of transistors 416. In sub-operation 704, threshold voltage compensation operation 700 electrically isolates the first drain (GUTT) of the first transistor Q1 and the second drain (GUTB) of the second transistor Q2 from a pre-charge voltage potential VBLP. For example, the control circuitry may de-assert the BLPR signal on the BLPR line to turn off transistor Q9 during the threshold voltage compensation period of time 502, as illustrated in the signal timing diagram 500.

In sub-operation 706 and sub-operation 708, threshold voltage compensation operation 700 operably couples a third gate of a third transistor Q3 to the first drain of the first transistor Q1 and a fourth gate of a fourth transistor Q4 to the second drain of the second transistor Q2. The control circuitry may assert the BLCP signal on the BLCP line during the threshold voltage compensation period of time 502, as illustrated in the signal timing diagram 500, to turn on the drain coupling pair of transistors 418 (Q5 and Q6).

In sub-operation 710, threshold voltage compensation operation 700 applies a logic level low voltage potential to a third source of the third transistor Q3 and a fourth source of the fourth transistor Q4. For example, the control circuitry may set the RNLF level on the RNLF line to VSS, as shown in the threshold voltage compensation period of time 502 of the signal timing diagram 500. In the sense amplifier 206 of FIG. 2, by turning the ACT and RNLF lines on (ACT to VDD and RNLF to VSS), the level of the first bit line 208 is made so as not to drop a significant amount. In the sense amplifier 406, however, since the voltage potential DLT of the first bit line 408 is not lowered (the first bit line 408 is electrically isolated from the GUTT line and the GUTB line), the threshold voltage compensation operation 700 may be carried out by only turning on RNLF without turning on ACT. In some embodiments the voltage potential of the RNLF signal may be VSS. Since the charging of the first bit line 408 and the second bit line 410 need not be carried out, however, RNLF may be driven to a logic level low voltage potential that falls short of the VSS extreme. Adjustments may be carried out by controlling a drivability of the sense amplifier 406. An amount of compensation of the threshold voltage mismatch may be increased by making the threshold voltage compensation period of time 502 relatively long (e.g., two nanoseconds) with a relatively weak RNLF (e.g., not at the VSS extreme). There may, therefore, exist some design tradeoffs between RNLF driving capability and the length of the threshold voltage compensation period of time 502.

In pre-charge operation 800, method 600 pre-charges a first drain of the first transistor Q1 and a second drain of the second transistor Q2 (i.e., the GUTT and GUTB lines).

Figure 8:
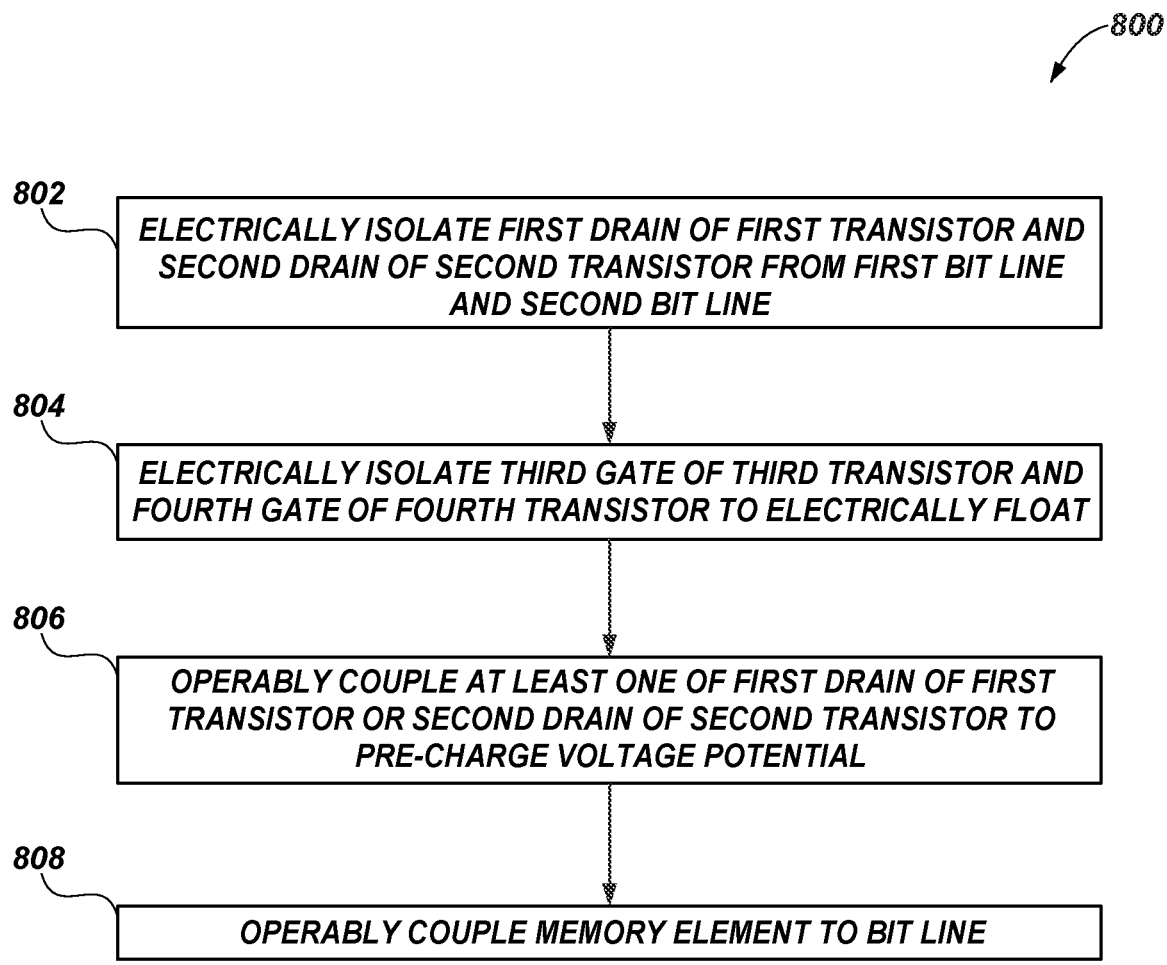
FIG. 8 is a flowchart illustrating an example of a precharge operation of the method of FIG. 6.

FIG. 8 is a flowchart illustrating an example of the pre-charge operation 800 of the method 600 of FIG. 6. Referring to FIG. 4, FIG. 5, FIG. 6, and FIG. 8 together, in sub-operation 802, pre-charge operation 800 electrically isolates the first drain of the first transistor Q1 and the second drain of the second transistor Q2 from a first bit line 408 and a second bit line 410. In sub-operation 804, pre-charge operation 800 electrically isolates the third gate of the third transistor and the fourth gate of the fourth transistor to electrically float. In the threshold voltage compensation period of time 502 corresponding to the threshold voltage compensation operation 700, by asserting the BLCP signal, the cross-coupled pair of transistors 412 and the compensation pair of transistors 420, which are operably coupled in series, make the gate level self-compensated. By de-asserting BLCP (turning off the drain coupling pair of transistors 418) in the pre-charge period of time 504 after completion of the threshold voltage compensation operation 700, the gate levels of the compensation pair of transistors 420 are continuously kept in a floating state in a threshold voltage compensated level.

In sub-operation 806, pre-charge operation 800 operably couples at least one of the first drain (GUTT) of the first transistor Q1 or the second drain (GUTB) of the second transistor Q2 to a pre-charge voltage potential VBLP. For example, the control circuitry may assert the control signal BLPR during the pre-charge period of time 504, as illustrated in the signal timing diagram 500. As a result, of the assertion of control signal BLPR, transistor Q9 is turned on, operably coupling the pre-charge voltage potential VBLP to the GUTB line. With VBLP operably coupled to the GUTB line, the GUTB and GUTT lines charge to the pre-charge voltage potential. Since the gates of the compensation pair of transistors 420 are electrically isolated from the GUTT line and the GUTB line during the pre-charge period of time 504, the gates of the compensation pair of transistors 420 are not pre-charged with the GUTT line and the GUTB line.

In sub-operation 808, pre-charge operation 800 operably couples a memory element (e.g., the storage capacitor SN0) to a bit line (e.g., the first bit line 408). For example, the control circuitry may assert the shared word line SWL0 during the pre-charge period of time 504, as illustrated in the signal timing diagram 500, turning on access transistor Q13 and operably coupling the storage capacitor SN0 to the first bit line 408. Of course, an of the memory cells operably coupled to the first bit line 408 or the second bit line 410 may be accessed during pre-charge operation 800 by asserting the appropriate shared word line. With the shared word line SWL0 asserted during the pre-charge period of time 504, the storage capacitor SN0 is operably coupled to the second gate of the second transistor Q2 line through the first bit line 408.

Figure 9:
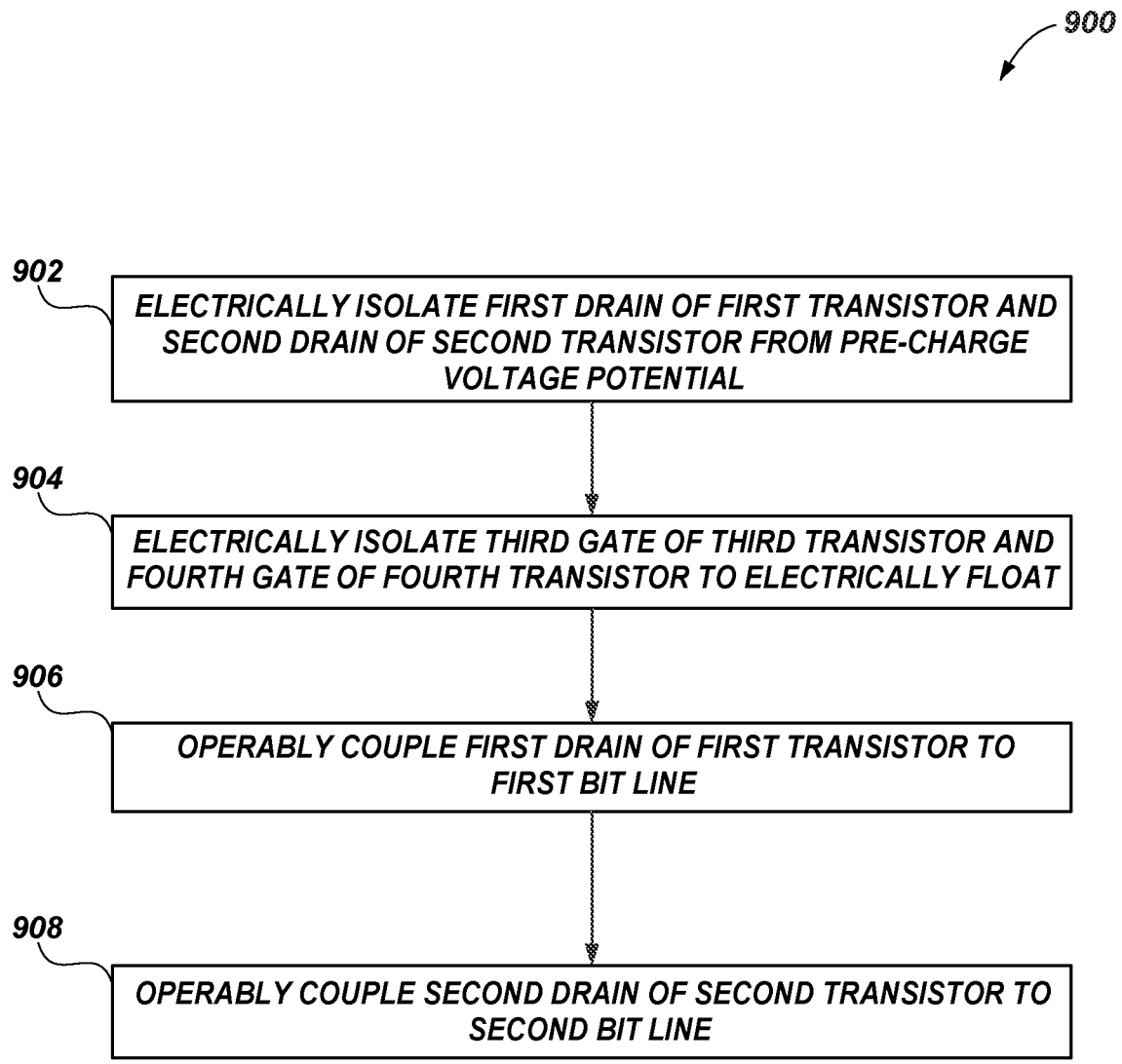
FIG. 9 is a flowchart illustrating an example of a sense amplifier connection operation of the method of FIG. 6.

FIG. 9 is a flowchart illustrating an example of the sense amplifier connection operation 900 of the method 600 of FIG. 6. Referring to FIG. 4, FIG. 5, FIG. 6, and FIG. 9 together, in sub-operation 902, sense amplifier connection operation 900 electrically isolates the first drain (GUTT) of the first transistor Q1 and the second drain (GUTB) of the second transistor from a pre-charge voltage potential VBLP. For example, the control circuitry may de-assert the BLPR signal on the BLPR line during the sense amplifier connection period of time 506, as shown in the signal timing diagram 500, to turn off transistor Q9 during the threshold voltage compensation period of time 502, as illustrated in the signal timing diagram 500.

In sub-operation 904, sense amplifier connection operation 900 electrically isolates the third gate of the third transistor and the fourth gate of the fourth transistor to electrically float. For example, the control circuitry may maintain the control signals GUTGP and BLCP in a de-asserted state during the sense amplifier connection period of time 506, as shown in the signal timing diagram 500, keeping transistors Q5, Q6, Q14, and 15 turned off. With the gates of the compensation pair of transistors 420 (Q3, Q4) maintained in the floating state, the voltage potential at the gates of the compensation pair of transistors 420 are maintained at the threshold voltage compensated level.

In sub-operation 906, sense amplifier connection operation 900 operably couples the first drain (GUTT) of the first transistor Q1 to the first bit line 408. In sub-operation 908, sense amplifier connection operation 900 operably couples the second drain (GUTB) of the second transistor Q2 to the second bit line 410. For example, the control circuitry may assert the ISOSA signal on the ISOSA line during the sense amplifier connection period of time 506, as shown in the signal timing diagram 500, turning on transistors Q7 and Q8. With the shared word line SWL0 asserted during the sense amplifier connection period of time 506 while the ISOSA signal is asserted, the storage capacitor SN0 is operably coupled to the GUTT line through the first bit line 408. With a voltage potential of the shared word line SWL0 rising during the sense amplifier connection period of time 506, an initial SN0 voltage potential is charge-shared to the first bit line 408. Since the voltage potential levels of the DLT/DLB measurements on the first bit line 208 and the second bit line 210 are lowered in the sense amplifier 206 of FIG. 2, a balance of a logic level high voltage potential and a logic level low voltage potential of the memory cell 202 may be collapsed after the charge share. In the sense amplifier 406 of FIG. 4, however, since the GUTT and GUTB lines are set to VBLP (e.g., 0.5 Volts), the balance of a logic level high voltage potential and a logic level low voltage potential of the memory cell 402 is kept steady. Also, with the gates of the compensation pair of transistors 420 held floating at a threshold voltage compensated level, the sense amplifier 406 is connected to the first bit line 408 and the second bit line 410 with any mismatch in threshold voltages of transistors Q1, Q2, Q3, and Q4 compensated for.

Figure 10:
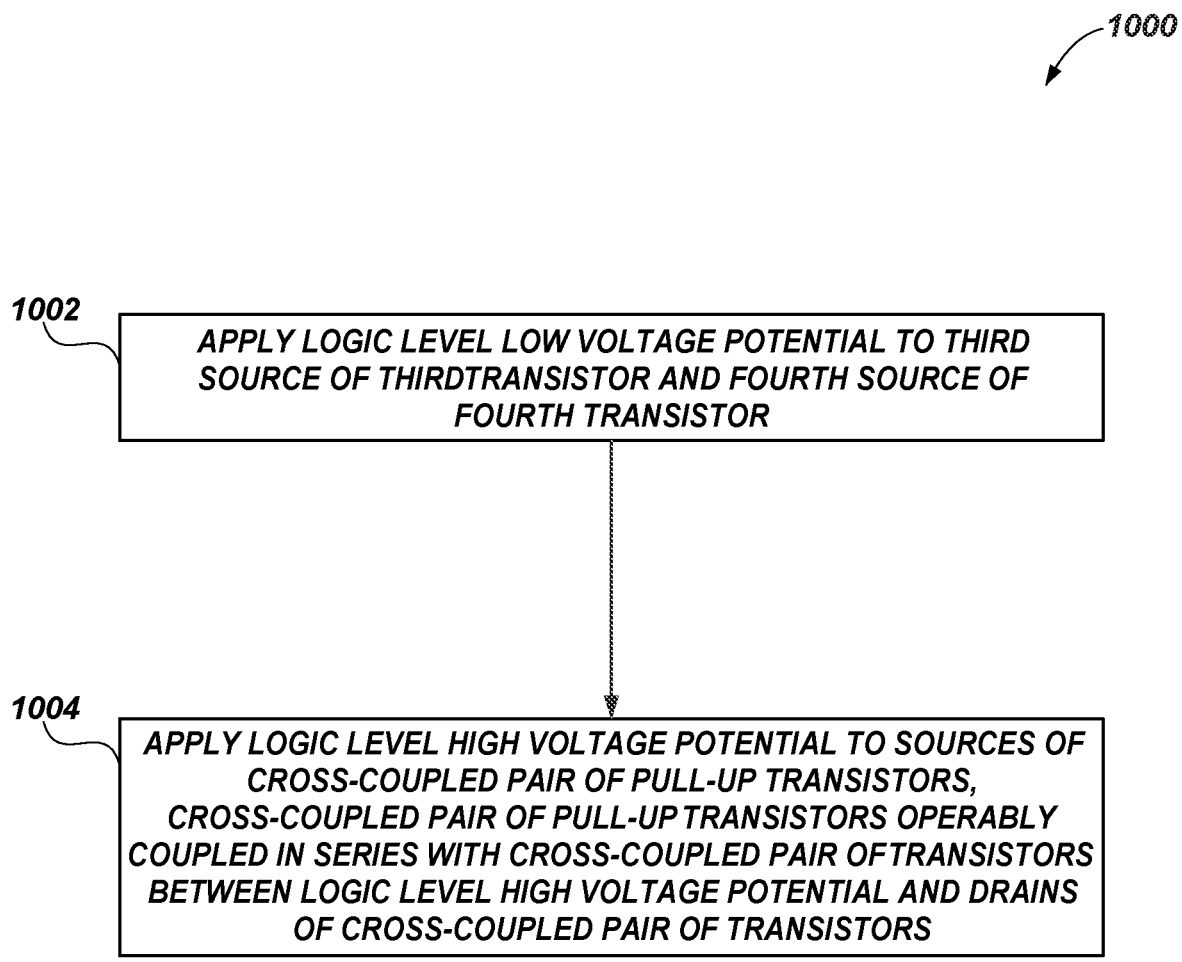
FIG. 10 is a flowchart illustrating an example of a sense amplifier powering operation of the method of FIG. 6.

FIG. 10 is a flowchart illustrating an example of the sense amplifier powering operation 1000 of the method 600 of FIG. 6. Referring to FIG. 4, FIG. 5, FIG. 6, and FIG. 10 together, in sub-operation 1002, sense amplifier powering operation 1000 applies a logic level low voltage potential (e.g., VSS) to a third source of the third transistor and a fourth source of the fourth transistor (to common source line RNLF). For example, the control circuitry may bias the RNLF line to a logic level low during the sense amplifier powering period of time 508, as shown in the signal timing diagram 500.

In sub-operation 1004, sense amplifier powering operation 1000 applies a logic level high voltage potential (e.g., VDD) to sources (ACT) of a cross-coupled pair of pull-up transistors 414, the cross-coupled pair of pull-up transistors operably coupled in series with the cross-coupled pair of transistors 412 between the logic level high voltage potential and drains of the cross-coupled pair of transistors 412. For example, the control circuitry may bias the ACT line to a logic level high during the sense amplifier powering period of time 508, as illustrated in the signal timing diagram 500. With the sense amplifier 406 operably coupled to power at the ACT and RNLF lines, the sense amplifier 406 amplifies the SN0 voltage measurement, which in turn drives the SN0 toward a logic level (high if the SN0 level is higher than the pre-charge voltage potential VBLP and low if the SN0 level is lower than the pre-charge voltage potential VBLP). In the example illustrated in FIG. 5, the SN0 measurement is driven toward the logic level high voltage potential, and the DLT measurement on the first bit line 408 (and the GUTT line, which is operably coupled to the first bit line 408) is driven toward the logic level high voltage potential with the SN0 measurement while the DLB measurement on the second bit line 410 (and the GUTB line, which is operably coupled to the second bit line 410) is driven toward the logic level low voltage potential. This driving, however, is relatively weak compared to that achieved by the sense amplifier 206 of FIG. 2 because the floating voltage potential of the gates of the compensation pair of transistors 420 is compensated to the pre-charge voltage potential VBLP or less at the time of sensing start. Accordingly, the gate coupling operation 1100 of FIG. 6 is used to increase the drive capability of the sense amplifier 406 to full capability.

Figure 11:
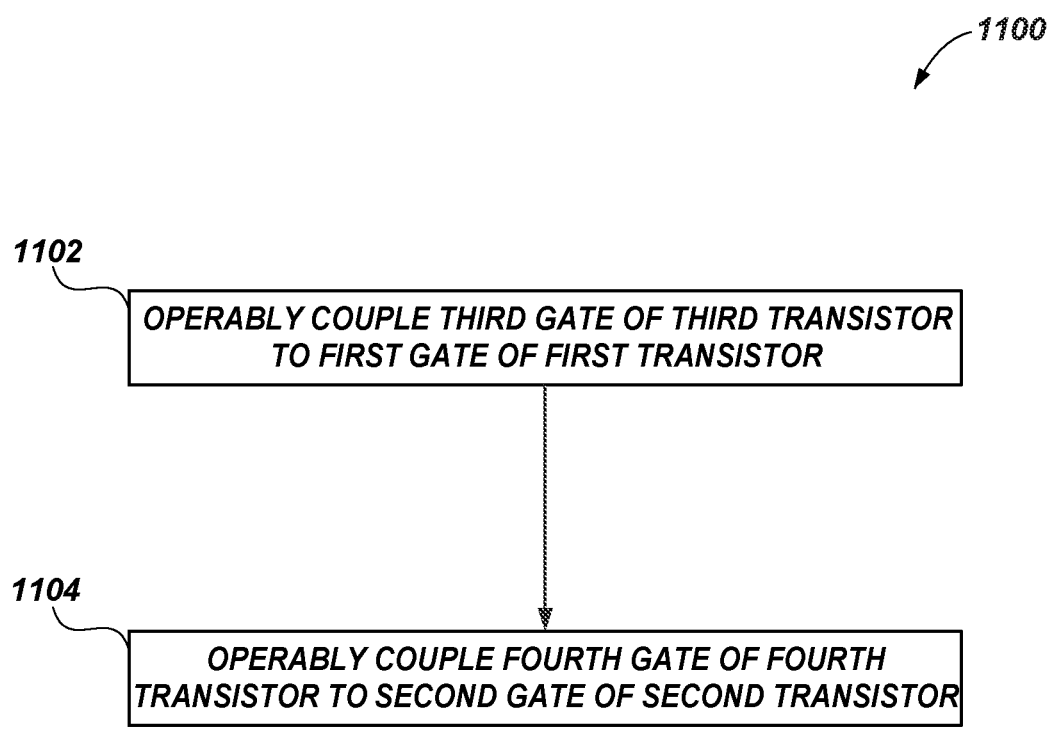
FIG. 11 is a flowchart illustrating an example of a gate coupling operation of the method of FIG. 6.

FIG. 11 is a flowchart illustrating an example of the gate coupling operation 1100 of the method 600 of FIG. 6. Referring to FIG. 4, FIG. 5, FIG. 6, and FIG. 11 together, in sub-operation 1102, gate coupling operation 1100 operably couples a third gate of the third transistor Q3 to the first gate of the first transistor Q1. In sub-operation 1104, gate coupling operation 1100 operably couples a fourth gate of the fourth transistor Q4 to the second gate of the second transistor Q2. For example, the control circuitry may assert the GUTGP signal on the GUTGP line during the gate coupling period of time 510, as illustrated in the signal timing diagram 500, turning on the gate coupling pair of transistors 424. As a result, the gates of the compensation pair of transistors 420 are operably coupled to the bit lines (the third gate of the third transistor Q3 is operably coupled to the second bit line 410 and the fourth gate of the fourth transistor Q4 is operably coupled to the first bit line 408). Accordingly, the compensation pair of transistors 420 contribute to driving the DLT, DLB measurements on the bit lines and the GUTT and GUTB lines and GUTGT and GUTGB toward logic levels (ACT and RNLF). In the example of FIG. 5, the DLT, GUTGB, and GUTT measurements are all driven further toward the ACT level during the gate coupling period of time 510 while the DLB, GUTGT, and GUTB measurements are all driven further toward the RNLF level during the gate coupling period of time 510.

Referring again to FIG. 4, FIG. 5, and FIG. 6, at operation 602, the method 600 includes sensing the bit lines (first bit line 408 and second bit line 410). With the bit lines charged at or near the ACT and RNLF levels responsive to the gate coupling operation 1100 of FIG. 11, the bit lines may be sensed to detect a charge state of the storage capacitor SN0.

The sense amplifier 406 of FIG. 4 includes four transistors (the cross-coupled pair of transistors 412 and the compensation pair of transistors 420) acting as pull-up transistors, as compared to the two transistors (the cross-coupled pair of transistors 212) of the sense amplifier 206 of FIG. 2 that act as pull-up transistors. As a result, a larger number of possible combinations of threshold voltage mismatches may occur between the pull-up transistors (Q1, Q2, Q3, and Q4) of the sense amplifier 406 (16 total possible mismatch combinations) as compared to the number of threshold voltage mismatches that may occur between the pull-up transistors (QS1 and QS2) of the sense amplifier 206 (four total possible mismatch combinations). In all of the possible combinations of threshold voltage mismatches for the sense amplifier 406, however, a sense margin of the sense amplifier 406 may be set to about the same as a sense margin of the sense amplifier 206.

Also, in the sense amplifier 206, an amount of current consumed by the sense amplifier 206 during the VtC compensation period of time 302 may be on the order of 10% to 20% of a total array current consumed during the VtC compensation period of time 302. By contrast, the current consumed by the sense amplifier 406 during the threshold voltage compensation period of time 502 may be set to substantially zero. Although the sense amplifier 406 uses an extra control signal (GUTGP) as compared to the sense amplifier 206, the amount of current consumed by the sense amplifier 406 due to this extra control signal as compared to the sense amplifier 206 is relatively small (e.g., negligible).

Furthermore, since the threshold voltage compensation operation 700 of the sense amplifier 406 is carried out only inside the sense amplifier 406, the corresponding threshold voltage compensation period of time 502 does not depend on lengths of the bit lines (e.g., first bit line 408, second bit line 410). Accordingly, the threshold voltage compensation period of time 502 of the sense amplifier 406 may be shorter than the VtC compensation period of time 302 of the sense amplifier 206. By way of non-limiting example, a length of the sense amplifier connection period of time 506 may in some embodiments be on the order of a few nanoseconds or less (e.g., less than or equal to two nanoseconds).

Figure 12:
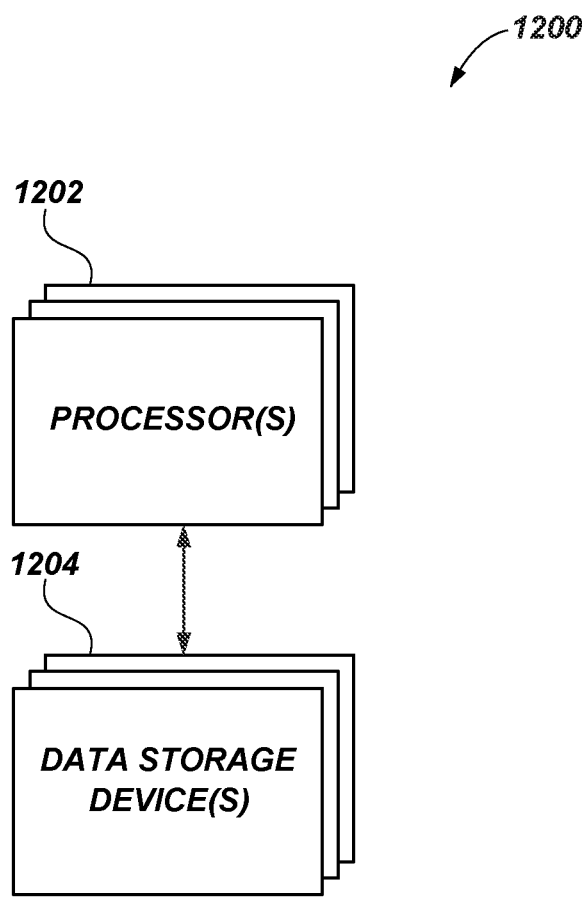
FIG. 12 is a block diagram of a computing device that may be used in some embodiments.

FIG. 12 is a block diagram of a computing device 1200 that may be used in some embodiments. The computing device 1200 includes one or more processors 1202 (sometimes referred to herein as "processors 1202") operably coupled to one or more data storage devices (sometimes referred to herein as "storage 1204"). The storage 1204 includes computer-readable instructions (e.g., software, firmware) stored thereon. The computer-readable instructions are configured to instruct the processors 1202 to perform operations of embodiments disclosed herein. For example, the computer-readable instructions may be configured to instruct the processors 1202 to perform at least a portion or a totality of the method 600 of FIG. 6, the threshold voltage compensation operation 700 of FIG. 7, the pre-charge operation 800 of FIG. 8, the sense amplifier connection operation 900 of FIG. 9, the sense amplifier powering operation 1000 of FIG. 10, and/or the gate coupling operation 1100 of FIG. 11. As another example, the computer-readable instructions may be configured to instruct the processors 1202 to perform at least a portion or a totality of the operations discussed for the control circuitry 106 of FIG. 1. As a specific, non-limiting example, the computer-readable instructions may be configured to instruct the processors 1202 to control signals and voltage potentials applied to the ACT, BLPR, VBLP, ISOSA, BLCP, GUTGP, RNLF, LIOT, LIOB, and CS lines of the memory device 100 of FIG. 1 to compensate for threshold voltage mismatches between transistors of a cross-coupled pairs of transistors (e.g., cross-coupled pair of transistors 212, cross-coupled pair of transistors 412, etc.) of a sense amplifiers 112 (e.g., sense amplifier 206, sense amplifier 406, etc.).

In some embodiments the processors 1202 include a central processing unit (CPU), a microcontroller, a programmable logic controller (PLC), other programmable device, or any combination thereof. In some embodiments the storage 1204 includes volatile data storage (e.g., random-access memory (RAM)), non-volatile data storage (e.g., Flash memory, a hard disc drive, a solid state drive, erasable programmable read-only memory (EPROM), etc.). In some embodiments the processors 1202 are configured to transfer computer-readable instructions stored in non-volatile data storage to volatile data storage for execution. In some embodiments the processors 1202 and the storage 1204 may be implemented into a single device (e.g., a semiconductor device product, a system on chip (SOC), etc.).

Figure 13:
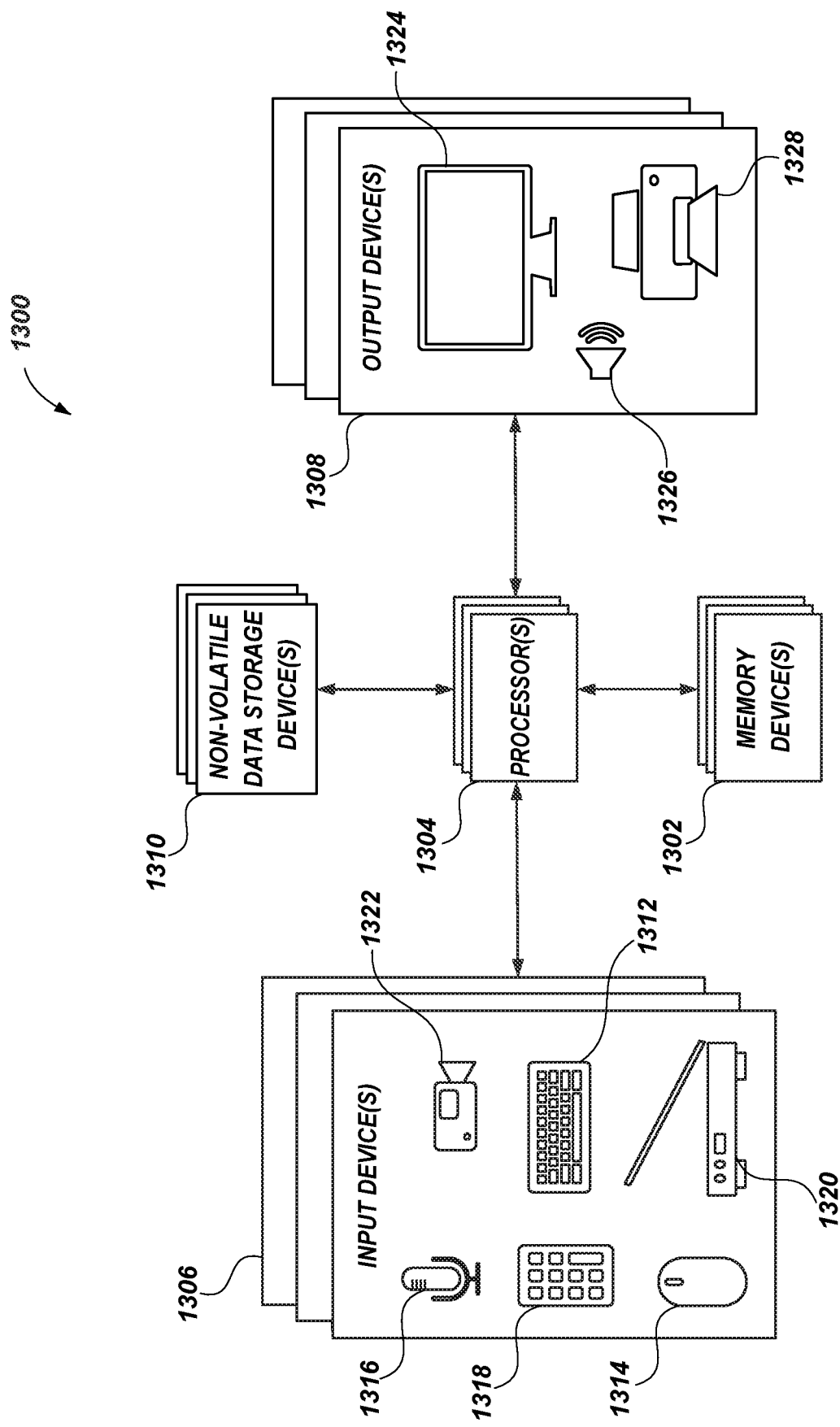
FIG. 13 is a block diagram of a computing system, according to some embodiments.

FIG. 13 is a block diagram of a computing system 1300, according to some embodiments. The computing system 1300 includes one or more processors 1304 operably coupled to one or more memory devices 1302, one or more non-volatile data storage devices 1310, one or more input devices 1306, and one or more output devices 1308. In some embodiments the computing system 1300 includes a desktop computer, a laptop computer, a tablet computer, a mobile computer (e.g., a smartphone, a personal digital assistant (PDA), etc.), a network server, or other computer device.

In some embodiments the one or more processors 1304 include a central processing unit (CPU) or other processor configured to control the computing system 1300. In some embodiments the one or more memory devices 1302 include random access memory (RAM), such as volatile data storage (e.g., dynamic RAM (DRAM) static RAM (SRAM), etc.). In some embodiments the one or more non-volatile data storage devices 1310 include a hard drive, a solid state drive, Flash memory, erasable programmable read only memory (EPROM), other non-volatile data storage devices, or any combination thereof. In some embodiments the one or more input devices 1306 include a keyboard 1312, a pointing device 1314 (e.g., a mouse, a track pad, etc.), a microphone 1316, a keypad 1318, a scanner 1320, a camera 1322, other input devices, or any combination thereof. In some embodiments the output devices 1308 include an electronic display 1324, a speaker 1326, a printer 1328, other output devices, or any combination thereof.

In some embodiments at least one of the memory devices 1302 or the non-volatile data storage devices 1310 include the memory device 100 of FIG. 1. Accordingly, in some embodiments at least one of the memory devices 1302 or the processors 1304 includes the threshold voltage compensation features discussed herein.

As used in the present disclosure, the terms "module" or "component" may refer to specific hardware implementations configured to perform the actions of the module or component and/or software objects or software routines that may be stored on and/or executed by general purpose hardware (e.g., computer-readable media, processing devices, etc.) of the computing system. In some embodiments, the different components, modules, engines, and services described in the present disclosure may be implemented as objects or processes that execute on the computing system (e.g., as separate threads). While some of the system and methods described in the present disclosure are generally described as being implemented in software (stored on and/or executed by general purpose hardware), specific hardware implementations or a combination of software and specific hardware implementations are also possible and contemplated.

As used in the present disclosure, the term "combination" with reference to a plurality of elements may include a combination of all the elements or any of various different subcombinations of some of the elements. For example, the phrase "A, B, C, D, or combinations thereof" may refer to any one of A, B, C, or D; the combination of each of A, B, C, and D; and any subcombination of A, B, C, or D such as A, B, and C; A, B, and D; A, C, and D; B, C, and D; A and B; A and C; A and D; B and C; B and D; or C and D.

Terms used in the present disclosure and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations.

In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

While the present disclosure has been described herein with respect to certain illustrated embodiments, those of ordinary skill in the art will recognize and appreciate that the present invention is not so limited. Rather, many additions, deletions, and modifications to the illustrated and described embodiments may be made without departing from the scope of the invention as hereinafter claimed along with their legal equivalents. In addition, features from one embodiment may be combined with features of another embodiment while still being encompassed within the scope of the invention as contemplated by the inventor.

What is claimed is:

1. An apparatus, comprising:
   a cross-coupled pair of transistors including a first transistor and a second transistor, a first gate of the first transistor operably coupled to a first bit line and a second gate of the second transistor operably coupled to a second bit line; and
   a compensation pair of transistors including a third transistor and a fourth transistor, the third transistor operably coupled in series with the first transistor between a first source of the first transistor and a common source line, the fourth transistor operably coupled in series with the second transistor between a second source of the second transistor and the common source line.

2. The apparatus of claim 1, wherein:
   a third gate of the third transistor is selectively configurable to electrically float, operably couple to a first drain of the first transistor, or operably couple to the first gate of the first transistor; and
   a fourth gate of the fourth transistor is selectively configurable to electrically float, operably couple to a second drain of the second transistor, or operably couple to the second gate of the second transistor.

3. The apparatus of claim 2, further comprising a drain coupling pair of transistors configured to selectively operably couple and isolate the third gate of the third transistor and the fourth gate of the fourth transistor to and from the first drain of the first transistor and the second drain of the second transistor, respectively.

4. The apparatus of claim 2, further comprising a gate coupling pair of transistors configured to selectively operably couple and isolate the third gate of the third transistor and the fourth gate of the fourth transistor to and from the first gate of the first transistor and the second gate of the second transistor, respectively.

5. The apparatus of claim 2, further comprising an isolation pair of transistors configured to selectively operably couple and isolate the first bit line to and from the first drain of the first transistor and the second bit line to and from the second drain of the second transistor.

6. The apparatus of claim 2, further comprising a pre-charge transistor configured to selectively operably couple and isolate a pre-charge voltage potential to and from at least one of the first drain of the first transistor or the second drain of the second transistor.

7. The apparatus of claim 1, wherein each of the first transistor, the second transistor, the third transistor, and the fourth transistor comprises an N-type metal oxide semiconductor transistor (NMOS transistor).

8. The apparatus of claim 1, wherein each of the first transistor, the second transistor, the third transistor, and the fourth transistor comprises a P-type metal oxide semiconductor transistor (PMOS transistor).

9. A memory device, comprising:
a sense amplifier including:
a cross-coupled pair of transistors comprising a first transistor and a second transistor, a first gate of the first transistor operably coupled to a first bit line and a second gate of the second transistor operably coupled to a second bit line; and
a compensation pair of transistors including a third transistor and a fourth transistor, the third transistor operably coupled in series with the first transistor between a first source of the first transistor and a common source line, the fourth transistor operably coupled in series with the second transistor between a second source of the second transistor and the common source line; and
control circuitry configured to control the sense amplifier in a threshold voltage compensation operation to:
operably couple a third gate of the third transistor to a first drain of the first transistor;
operably couple a fourth gate of the fourth transistor to a second drain of the second transistor; and
electrically isolate the first drain of the first transistor and the second drain of the second transistor from the first bit line and the second bit line.

10. The memory device of claim 9, wherein the control circuitry is further configured to control the sense amplifier in a pre-charge operation to:
electrically isolate the third gate of the third transistor to electrically float the third gate;
electrically isolate the fourth gate of the fourth transistor to electrically float the fourth gate; and
operably couple a pre-charge voltage potential to at least one of the first drain of the first transistor or the second drain of the second transistor while the first drain of the first transistor and the second drain of the second transistor are electrically isolated from the first bit line and the second bit line.

11. The memory device of claim 9, wherein the control circuitry is further configured to:
access a memory cell operably coupled to the first bit line or the second bit line; and
control the sense amplifier in a sense amplifier connection operation to operably couple the first bit line to the first drain of the first transistor and the second bit line to the second drain of the second transistor while the third gate of the third transistor and the fourth gate of the fourth transistor are electrically isolated to electrically float.

12. The memory device of claim 9, wherein the control circuitry is further configured to control the sense amplifier in a main sense operation to drive an active positive control signal (ACT signal) high and drive the common source line low while the first drain of the first transistor is operably coupled to the first bit line and the second drain of the second transistor is operably coupled to the second bit line, and while the third gate of the third transistor and the fourth gate of the fourth transistor are electrically isolated to electrically float.

13. The memory device of claim 9, wherein the control circuitry is further configured to control the sense amplifier in a gate coupling operation to:
operably couple the third gate of the third transistor to the first gate of the first transistor; and
operably couple the fourth gate of the fourth transistor to the second gate of the second transistor while an active positive control signal (ACT signal) is held high, the common source line is held low, the first drain of the first transistor is operably coupled to the first bit line and the second drain of the second transistor is operably coupled to the second bit line.

14. The memory device of claim 13, wherein:
the sense amplifier includes a gate coupling pair of transistors operably coupled between the third gate of the third transistor and the first gate and between the fourth gate of the fourth transistor and the second gate of the second transistor; and
the control circuitry is configured to turn on the gate coupling pair of transistors during the gate coupling operation to operably couple the third gate of the third transistor to the first gate of the first transistor and operably couple the fourth gate of the fourth transistor to the second gate of the second transistor.

15. The memory device of claim 9, further comprising an array of memory cells, a first plurality of memory cells of the array of memory cells operably coupled to the first bit line and a second plurality of memory cells of the array of memory cells operably coupled to the second bit line.

16. The memory device of claim 15, wherein at least a portion of the first plurality of memory cells or the second plurality of memory cells comprises volatile memory cells.

17. The memory device of claim 15, wherein at least a portion of the first plurality of memory cells comprises charge storage elements.

18. A computing system, comprising:
at least one memory device including a sense amplifier comprising a cross-coupled pair of transistors and a compensation pair of transistors, the compensation pair of transistors operably coupled in series with the cross-coupled pair of transistors between the cross-coupled pair of transistors and a common source line;
wherein the at least one memory device is configured to selectively electrically isolate gates of the compensation pair of transistors to electrically float the gates.

19. The computing system of claim 18, wherein the at least one memory device is configured to selectively operably couple the gates of the compensation pair of transistors to drain terminals of the cross-coupled pair of transistors.

20. The computing system of claim 18, further comprising:
one or more processors operably coupled to the at least one memory device;

one or more non-volatile data storage devices operably coupled to the one or more processors;
one or more input devices operably coupled to the one or more processors; and
one or more output devices operably coupled to the one or more processors.

\* \* \* \* \*